United States Patent
Kagawa

(10) Patent No.: US 8,642,464 B2
(45) Date of Patent: Feb. 4, 2014

(54) METHOD OF MANUFACTURING SEMICONDUCTOR DEVICE

(75) Inventor: Takeshi Kagawa, Kuwana (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/562,818

(22) Filed: Jul. 31, 2012

(65) Prior Publication Data

US 2013/0065389 A1 Mar. 14, 2013

(30) Foreign Application Priority Data

Sep. 12, 2011 (JP) ................................. 2011-198023

(51) Int. Cl.
*H01L 21/768* (2006.01)

(52) U.S. Cl.
USPC ............ 438/618; 257/E21.575; 257/E21.627; 257/E21.641; 257/E21.658; 438/98; 438/233; 438/523; 438/533; 438/586; 438/597; 438/666

(58) Field of Classification Search
USPC .................... 257/E21.575, E21.627, E21.641, 257/E21.658; 438/98, 233, 523, 533, 586, 438/597, 618, 666
See application file for complete search history.

(56) References Cited

U.S. PATENT DOCUMENTS

| 6,081,016 A | 6/2000 | Tanaka et al. |
| 6,251,723 B1 | 6/2001 | Takaishi |
| 2008/0124862 A1* | 5/2008 | Shiratake ...................... 438/239 |

FOREIGN PATENT DOCUMENTS

| JP | 8-330314 A | 12/1996 |
| JP | 11-345887 A | 12/1999 |
| JP | 2000-114481 A | 4/2000 |

* cited by examiner

*Primary Examiner* — Asok K Sarkar
(74) *Attorney, Agent, or Firm* — Westerman, Hattori, Daniels & Adrian, LLP

(57) ABSTRACT

A method of manufacturing a semiconductor device includes forming a first interconnection and a second interconnection above a semiconductor substrate, forming a first sidewall insulating film on a side wall of the first interconnection, and a second sidewall insulating film on a side wall of the second interconnection, forming a conductive film above the semiconductor substrate with the first interconnection, the first sidewall insulating film, the second interconnection and the second sidewall insulating film formed on, and selectively removing the conductive film above the first interconnection and the second interconnection to form in a region between the first interconnection and the second interconnection a third interconnection formed of the conductive film and spaced from the first interconnection and the second interconnection by the first sidewall insulating film and the second sidewall insulating film.

8 Claims, 27 Drawing Sheets

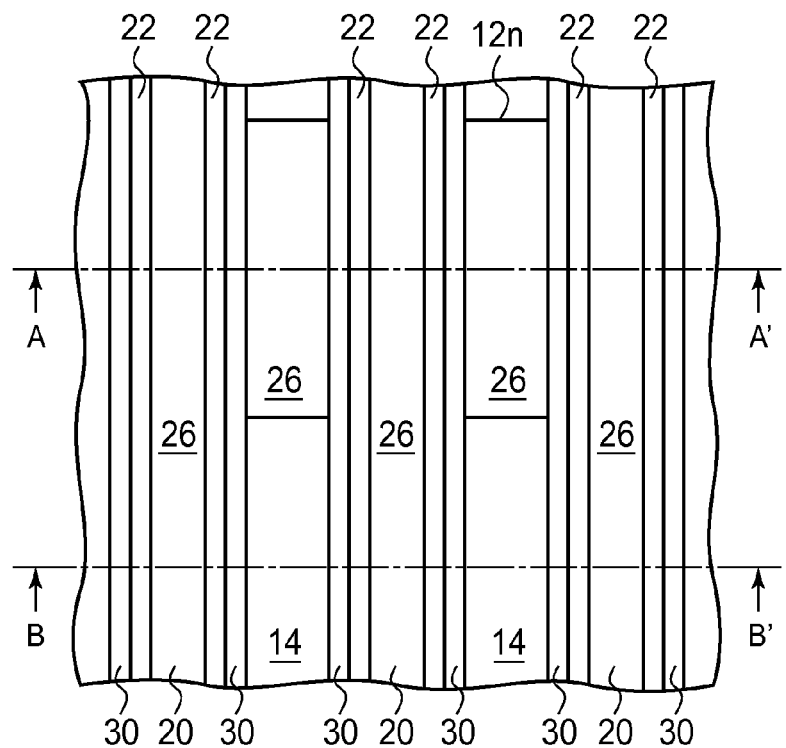
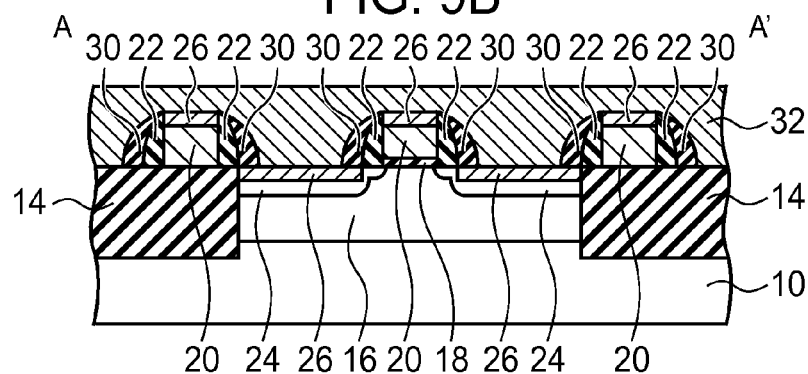
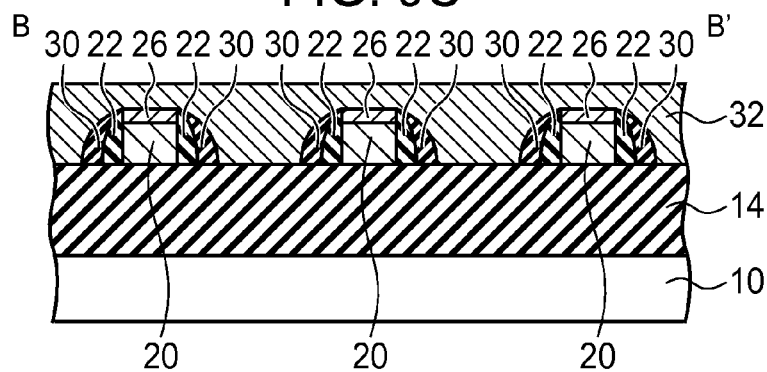

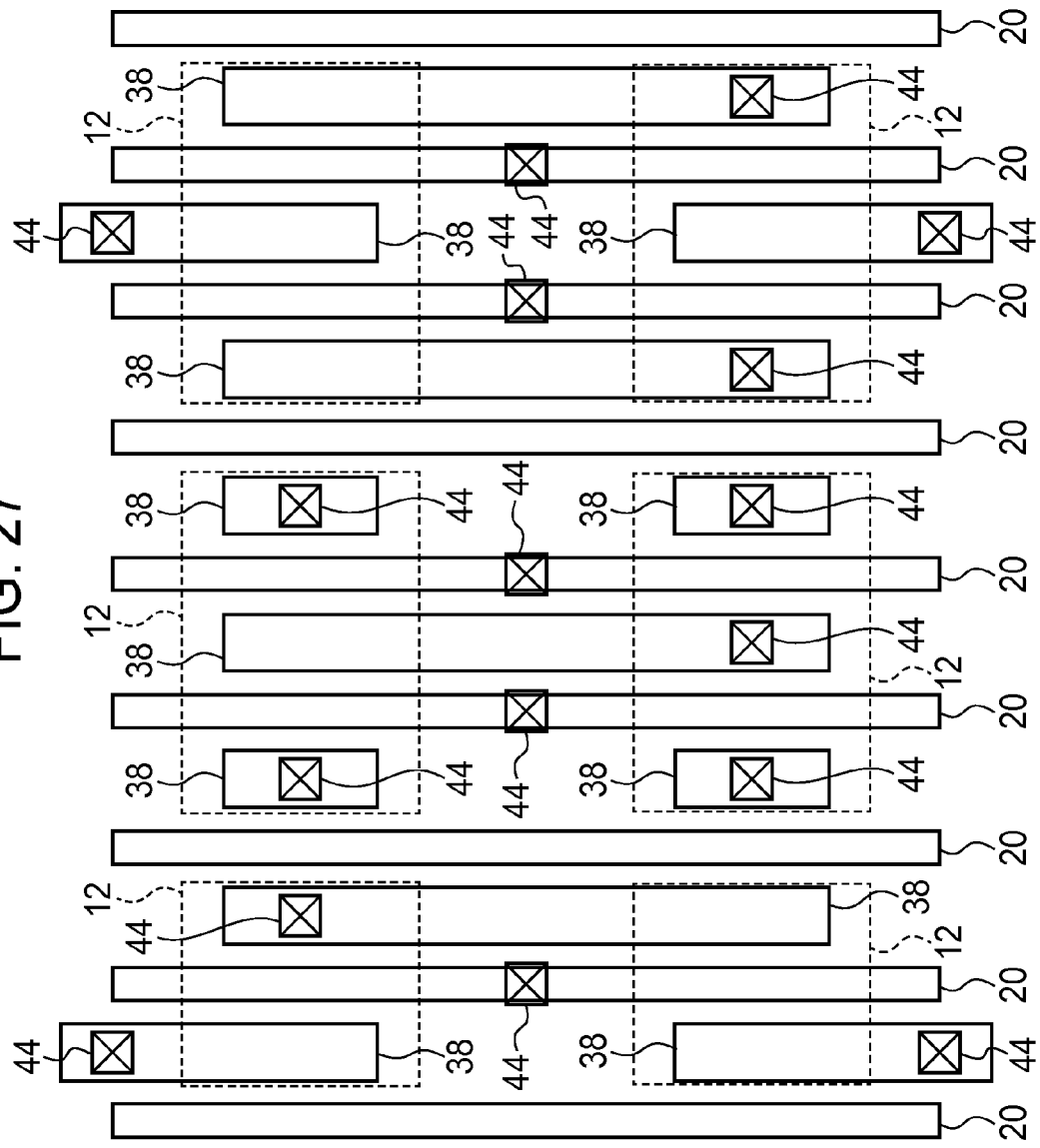

METHOD OF MANUFACTURING SEMICONDUCTOR DEVICE

CROSS-REFERENCE TO RELATED APPLICATION

This application is based upon and claims the benefit of priority of the prior Japanese Patent Application No. 2011-198023, filed on Sep. 12, 2011, the entire contents of which are incorporated herein by reference.

FIELD

The embodiments discussed herein are related to a method of manufacturing a semiconductor device including a local interconnection.

BACKGROUND

As an interconnection interconnecting between an impurity diffused region formed in a semiconductor substrate and a lead-out line from the impurity region, a local interconnection formed of a conductive layer below the first metal interconnection layer is often used. As a method of forming the local interconnection is known the method of forming a trench in an inter-layer insulating film covering a gate electrode down to the impurity diffused region and filling an interconnection material in the trench.

The followings are examples of related: Japanese Laid-open Patent Publication No. 08-330314; Japanese Laid-open Patent Publication No. 11-345887; and Japanese Laid-open Patent Publication No. 2000-114481.

However, in the above-described method of forming the local interconnection, photolithography is used in forming the trench in the inter-layer insulating film. In the photolithography, alignment is made by using the alignment mark of the base pattern (an active layer and/or a gate layer), which often causes the disalignment with a gate electrode. In forming a contact to be connected to the gate electrode, it is necessary to take into consideration the disalignment between the gate electrode and the local interconnection. For this, the allowable range of the disalignment of the contact must be set wide, which has been a factor for blocking the integration.

SUMMARY

According to one aspect of an embodiment, there is provided a method of manufacturing a semiconductor device including forming a first interconnection and a second interconnection above a semiconductor substrate, forming a first sidewall insulating film on a side wall of the first interconnection, and a second sidewall insulating film on a side wall of the second interconnection, forming a conductive film above the semiconductor substrate with the first interconnection, the first sidewall insulating film, the second interconnection and the second sidewall insulating film formed on, and selectively removing the conductive film above the first interconnection and the second interconnection to form in a region between the first interconnection and the second interconnection a third interconnection formed of the conductive film and spaced from the first interconnection and the second interconnection by the first sidewall insulating film and the second sidewall insulating film.

According to another aspect of an embodiment, there is provided a method of manufacturing a semiconductor device including forming a first interconnection and a second interconnection above a semiconductor substrate, forming a first sidewall insulating film on a side wall of the first interconnection, and a second side wall insulating film on a side wall of the second interconnection, forming a sacrificial film above the semiconductor substrate with the first interconnection, the first sidewall insulating film, the second interconnection and the second sidewall insulating film formed on, forming an opening in the sacrificial film in a region between the first interconnection and the second interconnection for a third interconnection to be formed in, forming a conductive film above the semiconductor substrate with the sacrificial film formed on, and selectively removing the conductive film above the sacrificial film to form the third interconnection of the conductive film in the opening, spaced from the first interconnection and the second interconnection by the first sidewall insulating film and the second sidewall insulating film.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 3A, 4A, 5A, 6A, 7A, 8A, 9A, 10A, 11A, 12A, 13A, 14A, 15A, 16A and 17A are plan views illustrating a method of manufacturing the semiconductor device according to the first embodiment;

FIGS. 3B, 3C, 4B, 4C, 5B, 5C, 6B, 6C, 7B, 7C, 8B, 8C, 9B, 9C, 10B, 10C, 11B, 11C, 12B, 12C, 13B, 13C, 14B, 14C, 15B, 15C, 16B, 16C, 17B and 17C are cross-sectional views illustrating a method of manufacturing the semiconductor device according to the first embodiment;

FIG. 27 is a plan view illustrating a structure of a semiconductor device according to a third modified embodiment.

DESCRIPTION OF EMBODIMENTS

[A First Embodiment]

A semiconductor device and a method of manufacturing a semiconductor device according to a first embodiment will be described with reference to FIGS. 1 to 17C.

Figure 1:
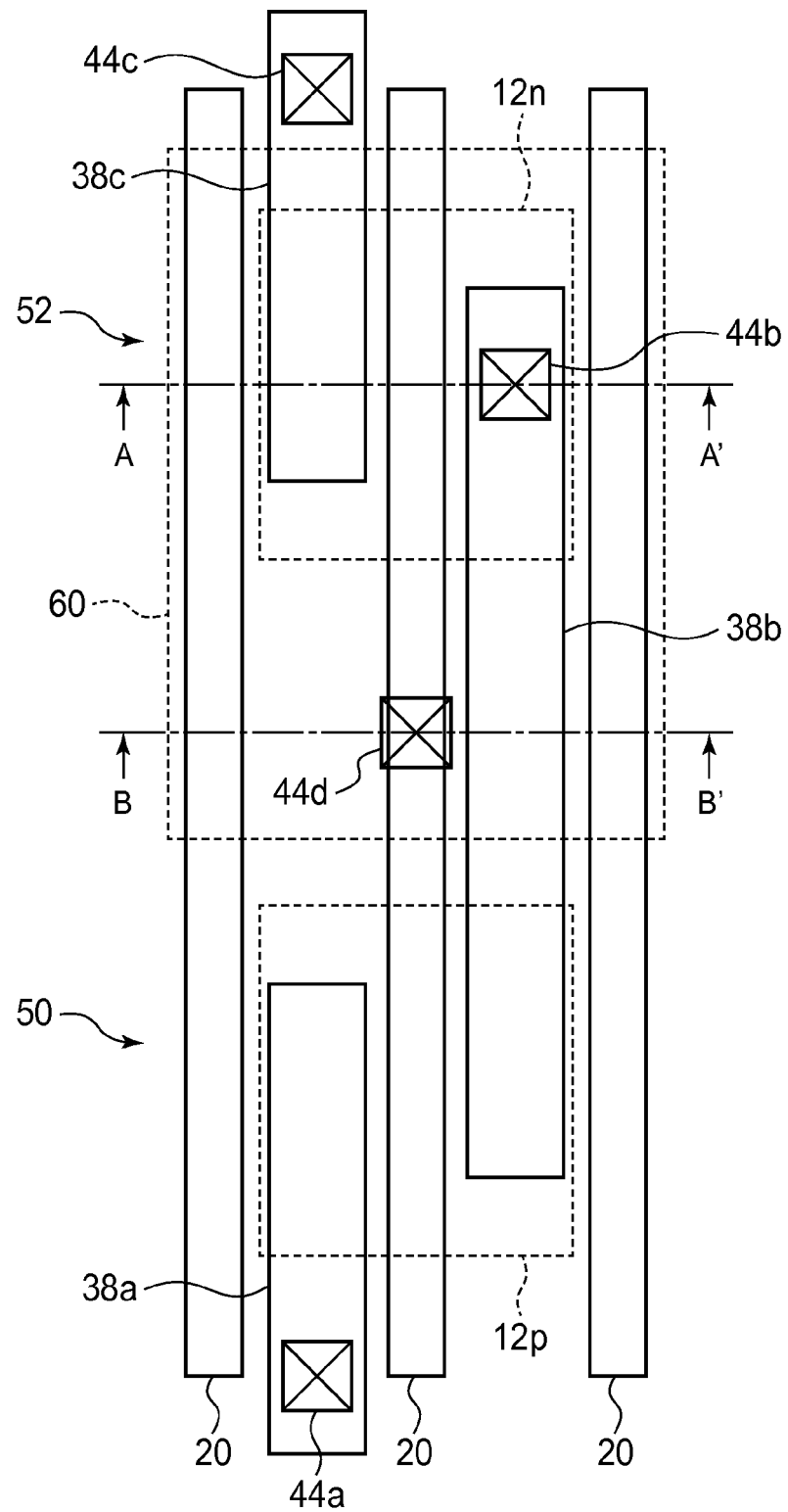
FIG. 1 is a plan view illustrating a structure of a semiconductor device according to a first embodiment.
Figure 2A:
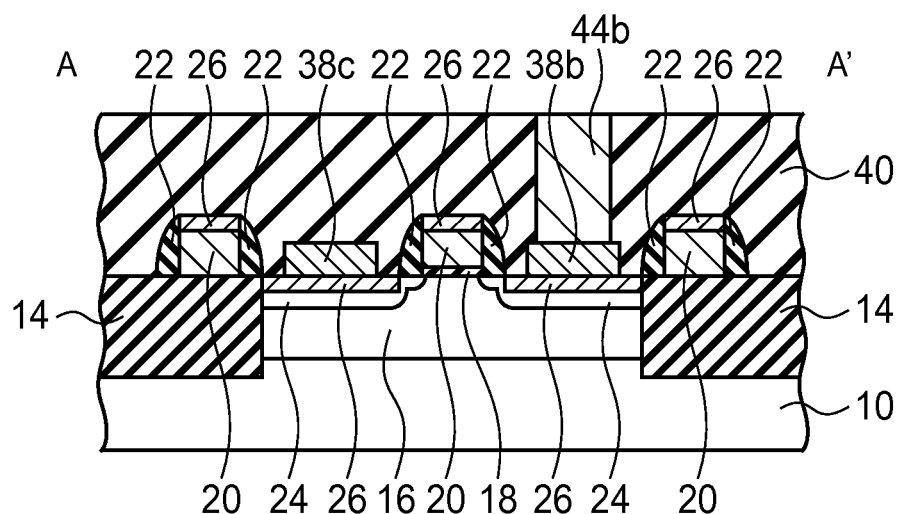
FIGS. 2A and 2B are diagrammatic cross-sectional views illustrating the structure of the semiconductor device according to the first embodiment.
Figure 2B:
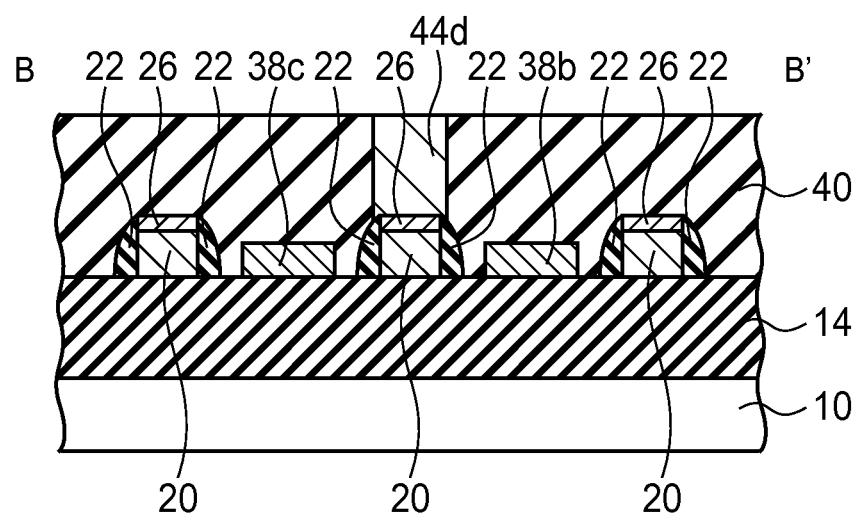

FIG. 1 is a plan view illustrating a structure of a semiconductor device according to the present embodiment. FIGS. 2A and 2B are diagrammatic cross-sectional views illustrating the structure of the semiconductor device according to the present embodiment. FIGS. 3A to 17C are plan views and cross-sectional views illustrating a method of manufacturing the semiconductor device according to the present embodiment.

First, the structure of the semiconductor device according to the present embodiment will be described with reference to FIGS. 1 to 2B. FIG. 2A is the A-A' line cross-sectional view of FIG. 1, and FIG. 2B is the B-B' line cross-sectional view of FIG. 1.

A device isolation insulating film 14 defining active regions 12n, 12p is formed in a silicon substrate 10. A plurality of gate electrodes arranged in parallel with each other are formed above the silicon substrate 10 with the device isolation film 14 formed on. The gate electrode 20 at the center of the drawing is formed, extended above the active region 12n and the active region 12p interposing a gate insulating film 18. P-type source/drain regions 24 and n-type source/drain regions (not illustrated) are formed in the active region 12n and the active region 12p on both sides of the gate electrode 20. Thus, an n-channel transistor 50 including the gate electrode 20 and the n-type source/drain regions is formed in the active region 12p. A p-type transistor 52 including the gate electrode 20 and the p-type source/drain regions 24 is formed in the active region 12n. A metal silicide film 26 is formed on the gate electrodes 20 and the source/drain regions, etc.

Local interconnections 38a, 38b, 38c are formed in the regions between the gate electrodes 20 in alignment with the gate electrodes 20. The local interconnection 38a is connected to the source region of the n-channel transistor 50 via the metal silicide film 26. The local interconnection 38b is connected to the drain region of the n-channel transistor 50 via the metal silicide film 26 and the source region of the p-channel transistor 52 via the metal silicide film 26 and electrically connecting between the drain region of the n-channel transistor 50 and the source region of the p-channel transistor 52. The local interconnection 38c is connected to the drain region of the p-channel transistor 52 via the metal silicide film 26. Generally, the local interconnection is an interconnection formed of a layer below the first metal interconnection layer, and interconnections interconnecting impurity diffused regions, lead-out interconnections from the impurity diffused regions, etc. are true for the local interconnections. In the specification of the present application, the "local interconnection" is often called simply the "interconnection".

An inter-layer insulating film 40 is formed above the silicon substrate 10 with the n-channel transistor 50, the p-channel transistor 52 and the local interconnections 38a, 38b, 38c formed on. Contact plugs 44a, 44b, 44c respectively connected to the local interconnections 38a, 38b, 38c, and a contact plug 44d connected to the gate electrodes 20 of the n-channel transistor 50 and the p-channel transistor 52 are buried in the inter-layer insulating film 40.

The contact plug 44a is electrically connected to a standard voltage line not illustrated. The contact plug 44d is electrically connected to an input signal line not illustrated. The contact plug 44b is electrically connected to an output signal line not illustrated.

As described above, the semiconductor device according to the present embodiment is an inverter circuit including the n-channel transistor 50 as a driver transistor and the p-channel transistor 52 as a load transistor.

In the semiconductor device according to the present embodiment, as described above, the local interconnections 38a, 38b, 38c formed between the gate electrodes 20 are formed in alignment with the gate electrodes 20. The local interconnections 38a, 38b, 38c being formed in alignment with the gate electrodes 20 means that the local interconnections 38a, 39b, 38b are formed at a constant interval from the gate electrodes 20, and no disalignment with the gate electrodes 20 takes place. By the manufacturing method to be described below, the local interconnections 38a, 38b, 38c can be formed in self-alignment with the gate electrodes 20 without positioning the local interconnections 38a, 38b, 38c with respect to the gate electrodes 20 by lithography.

Next, The method of manufacturing the semiconductor device according to the present embodiment will be described with reference to FIGS. 3A to 17C. In each drawing, the drawing A is a plan view of the region 60 in FIG. 1, the drawing B is the A-A' line cross-sectional view of the drawing A, and the drawing C is the B-B' line cross-sectional view of the drawing A.

First, the device isolation insulating film defining the active regions 12n, 12p are formed in the silicon substrate 10 by, e.g. STI (Shallow Trench Isolation) method.

Figure 3A:
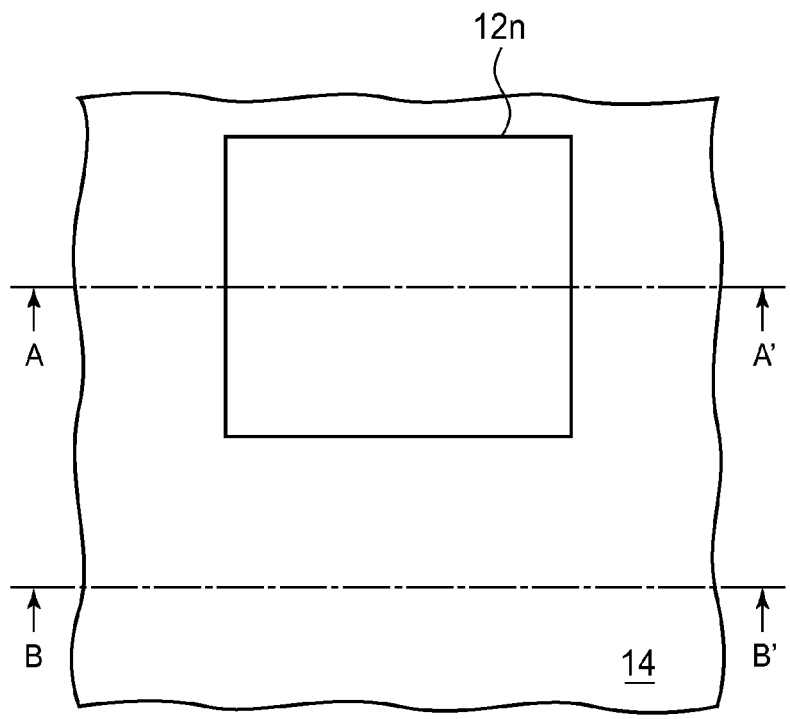
Figure 3B:
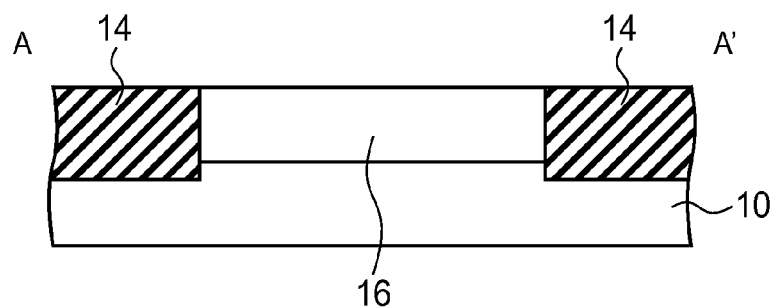
Figure 3C:
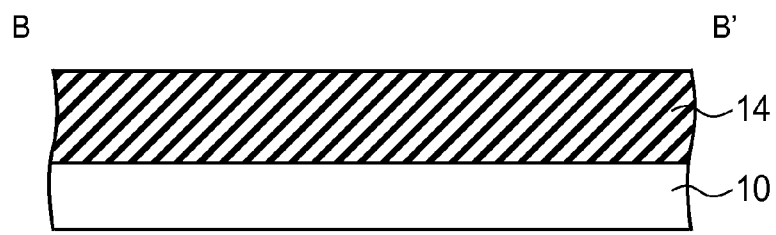

Then, by ion implantation, a p-well (not illustrated) is formed in the active region 12n, and an n-well 16 is formed in the active region 12p (FIGS. 3A, 3B and 3C). When the p-well and the n-well 16 are formed, prescribed channel ion implantations are also made.

Then, the gate insulating film 18, of, e.g., silicon oxide film is formed on the active regions 12n, 12p by, e.g., thermal oxidation method.

Next, a polycrystalline silicon film is deposited over the entire surface by, e.g., CVD (chemical vapor deposition) method.

Figure 4A:
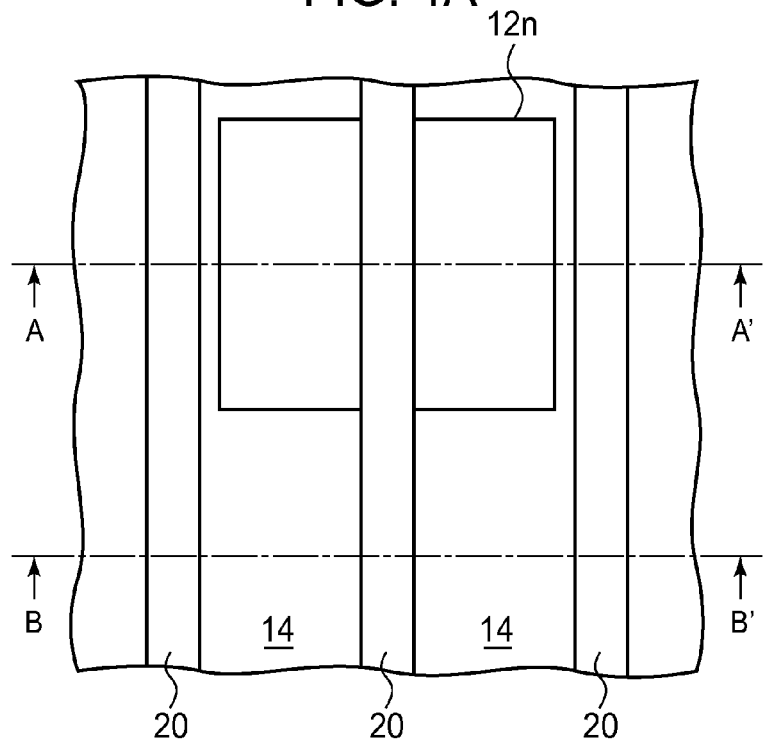
Figure 4B:
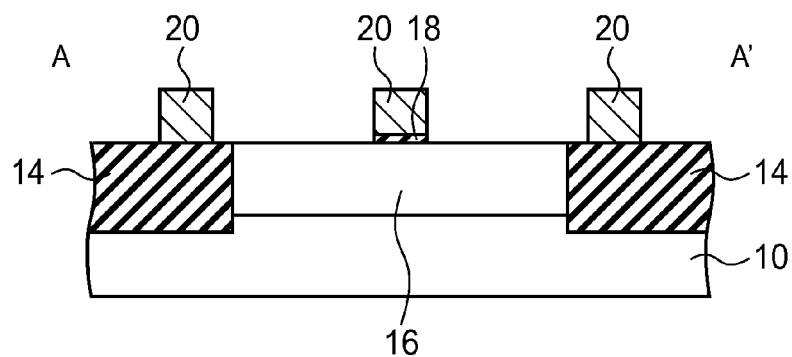
Figure 4C:
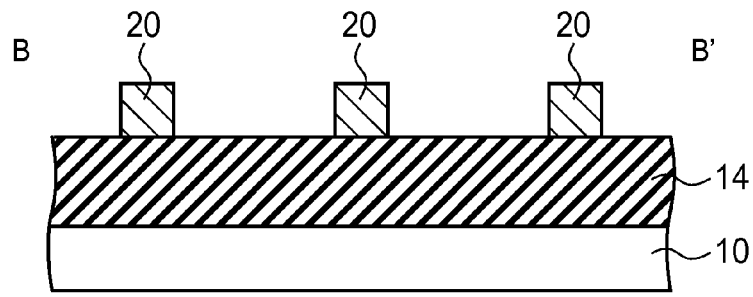

Next, the polycrystalline silicon film is patterned by photolithography and dry etching to form the gate electrodes 20 (FIGS. 4A, 4B and 4C). For example, in the semiconductor device of, e.g., the 22 nm-generation, the gate electrodes 20 of a 22 nm-gate length are arranged in stripes at, e.g., a 90 nm-pitch.

In the semiconductor device according to the present embodiment, the gate electrodes 20 which are practically used is only the gate electrode of the illustrated 3 gate electrodes 20, which is positioned at the center. The gate electrodes 20 on both sides are the so-called dummy electrodes. The gate electrodes 20 are arranged at a fixed pitch between the gate electrodes 20, whereby the dimensions of the gate electrodes 20 can be unified. Such layout has been standardized in the semiconductor devices of the 28 nm-generation and its following generations.

Then, ion implantation is made in the active region 12n with the gate electrodes 20 as the mask to form the impurity diffused regions to be the extension regions of the p-channel transistor 52. Similarly, ion implantation is made in the active region 12p with the gate electrodes 20 as the mask to form the impurity diffused regions to be the extension regions of the n-channel transistor 50.

Next, a silicon nitride film is deposited by, e.g., CVD method, and then is etched back to form the sidewall insulating films (a first insulating portion/a third insulating portion) 22 on the side walls of the gate electrodes 20.

Then, ion implantation is made with the gate electrodes 20 and the sidewall insulating films 22 as the mask to form the impurity diffused regions to be the source/drain regions in the active region 12n on both sides of the gate electrode 20. Similarly, ion implantation is made with the gate electrodes 20 and the sidewall insulating films 22 as the mask to form the impurity diffused regions to be the source/drain regions in the active region 12p on both sides of the gate electrode 20.

Figure 5A:
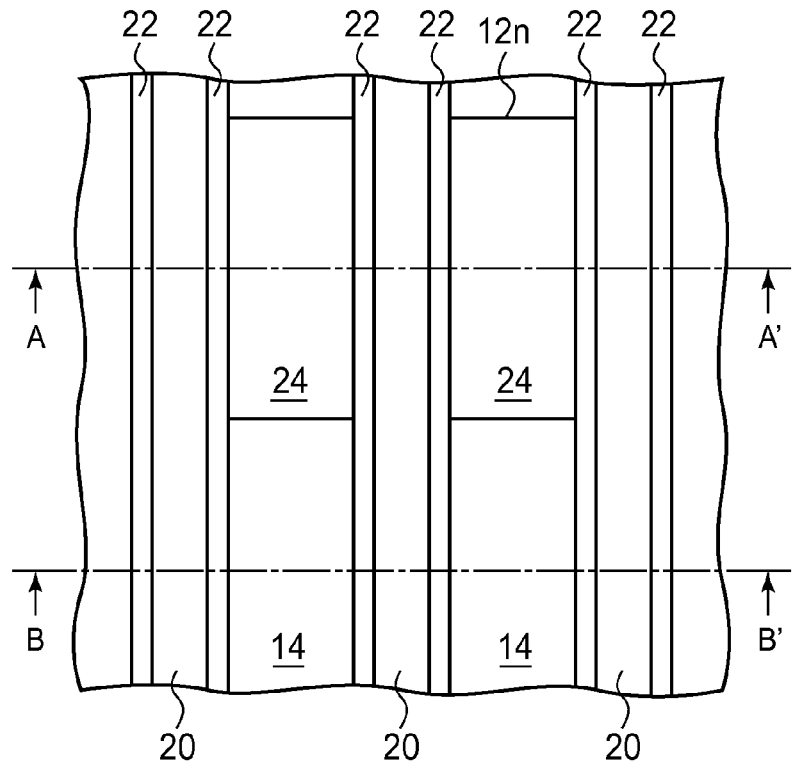
Figure 5B:
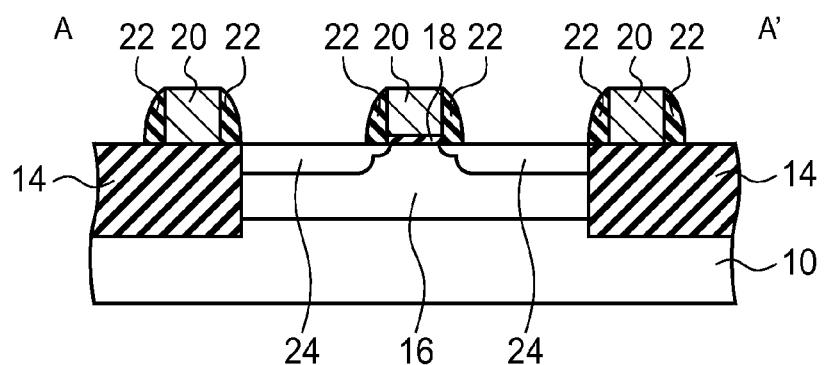
Figure 5C:
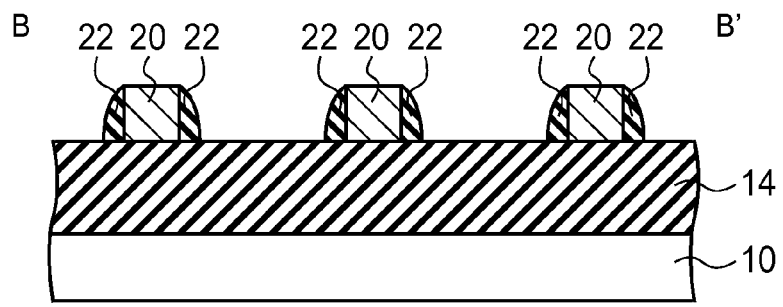

Next, the implanted impurity is activated to form the source/drain regions 24 in the active region 12n on both sides of the gate electrode 20 and the source/drain regions (not illustrated) in the active region 12p on both sides of the gate electrode 20 (FIGS. 5A, 5B and 5C).

Thus, the n-channel transistor 50—is formed in the active region 12p, and the p-channel transistor 52 is formed in the active region 12n.

Figure 6A:
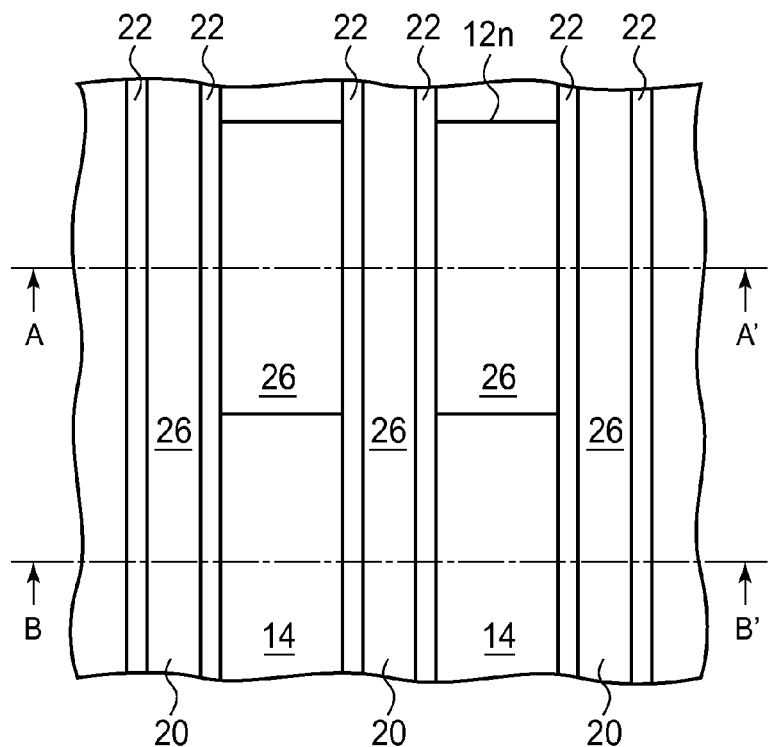
Figure 6B:
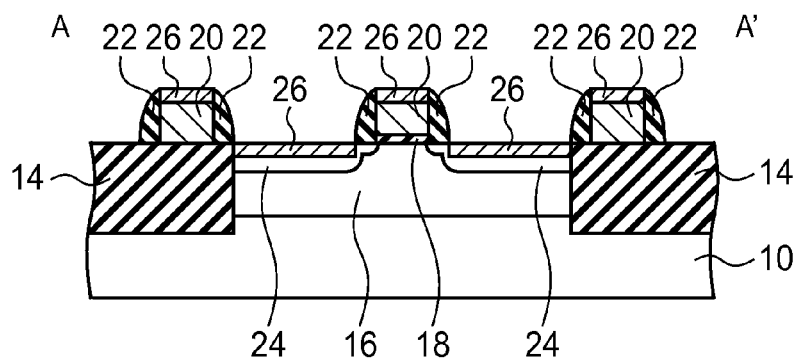
Figure 6C:
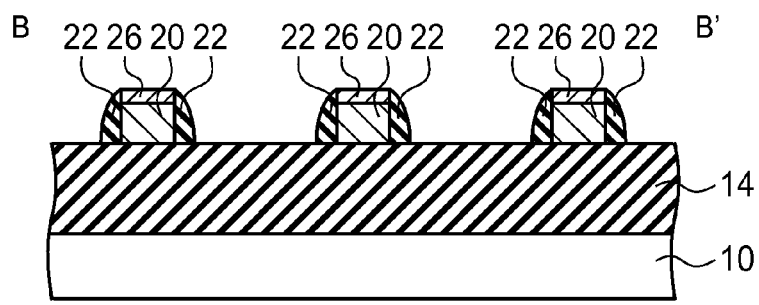

Next, by self-aligned silicide (salicide) process, the metal silicide film 26 is formed selectively on the gate electrodes 20 and the source/drain regions 24 (FIGS. 6A, 6B and 6C).

Figure 7A:
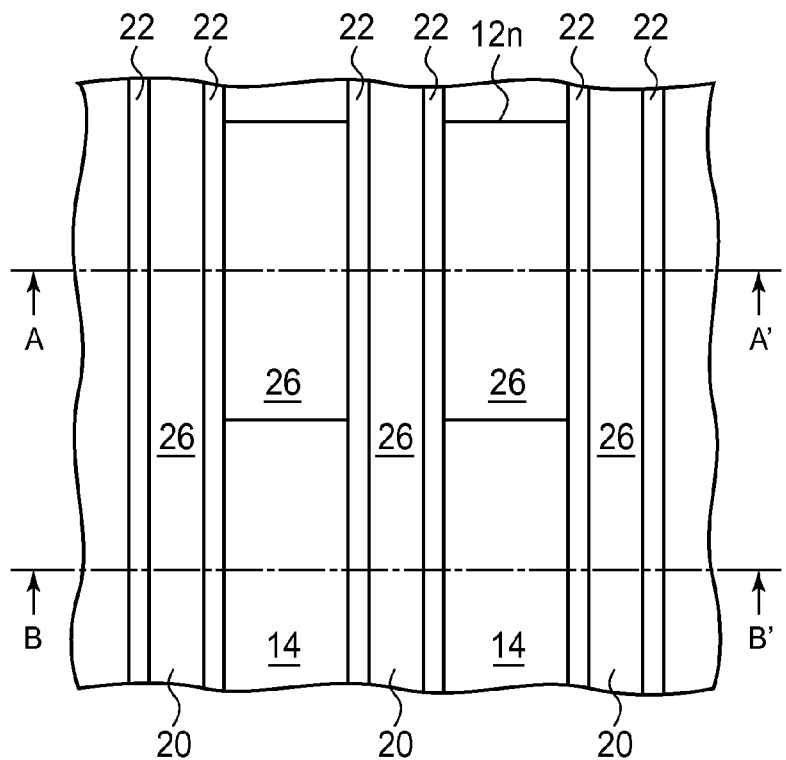
Figure 7B:
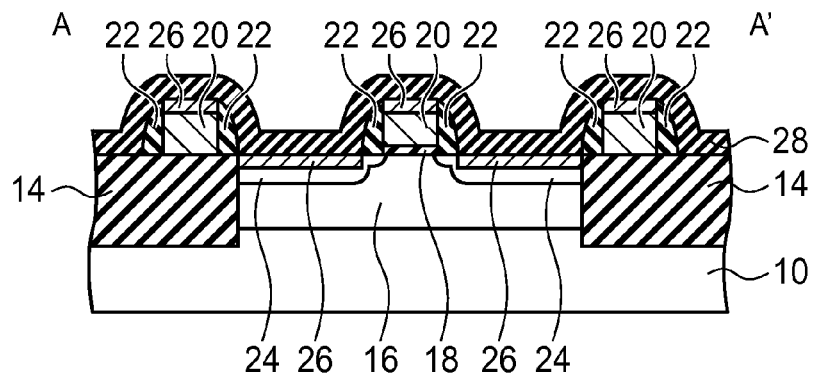
Figure 7C:
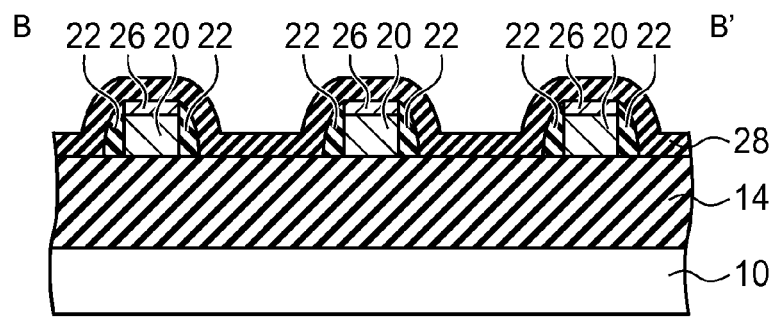

Then, a silicon oxide film 28 is formed above the entire surface by, e.g., CVD method (FIGS. 7A, 7B and 7C). In the semiconductor device of, e.g., the 22 nm-generation, the silicon oxide film 28 of, e.g., an bout 15 nm-thickness is formed. In place of the silicon oxide film 28, another film of a material which can be etched selectively with respect to the sidewall insulating films 22, the metal silicide film 26 and the local interconnections 38a, 38b, 38c to be formed later can be used.

Figure 8A:
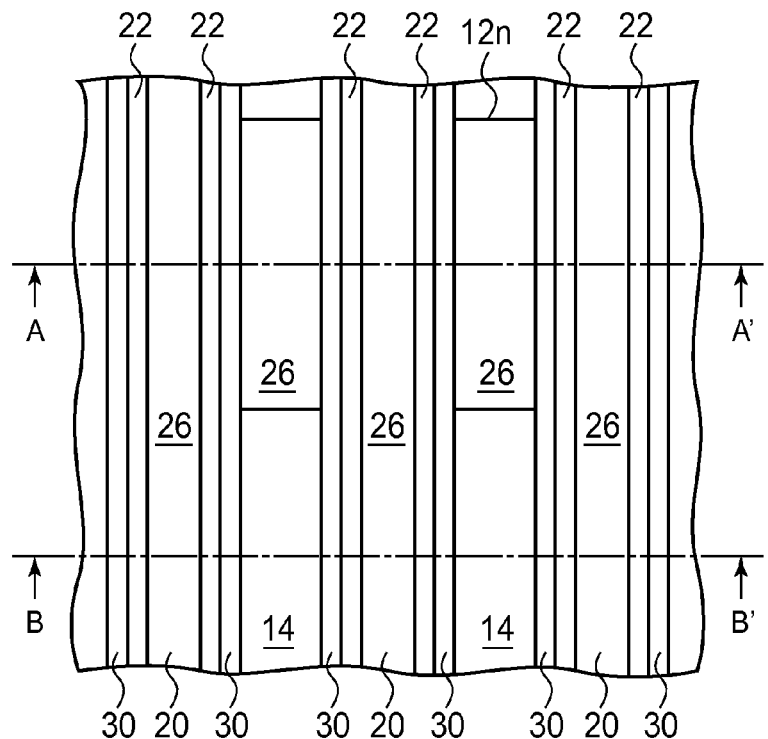
Figure 8B:
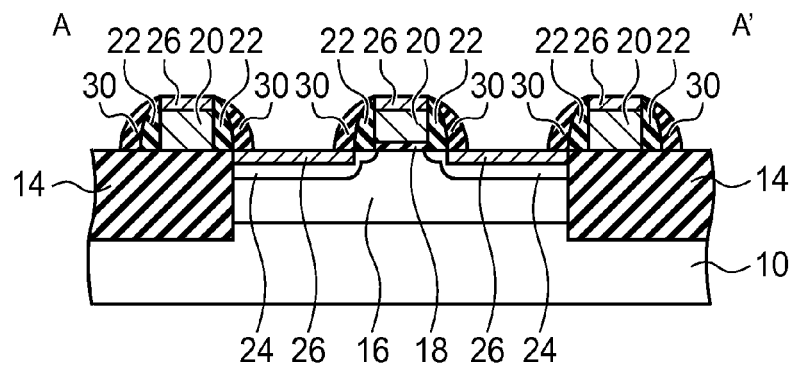
Figure 8C:
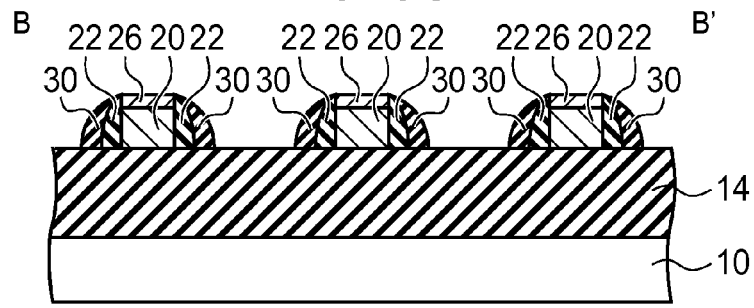

Next, the silicon oxide film 28 is etched back to form sidewall insulating films (a second insulating portion/a fourth insulating portion) 30 of the silicon oxide film 28 above the side walls of the gate electrodes 20 with the sidewall insulating films 22 formed on (FIGS. 8A, 8B and 8C).

Then, a tungsten film is deposited by, e.g., CVD method, and the surface of the tungsten film is polished by, e.g., CMP (chemical mechanical polishing) method to form a tungsten film 32 having the surface planarized (FIGS. 9A, 9B and 9C). In the semiconductor device of, e.g., the 22 nm-generation, the tungsten film 32 of, e.g., an about 35 nm-thickness is formed.

The tungsten film 32 is for forming the local interconnections 38a, 38b, 38c. The material forming the local interconnections 38a, 38b, 38c is not limited to tungsten, and in place of the tungsten film 32, another conductive film may be formed.

Figure 10A:
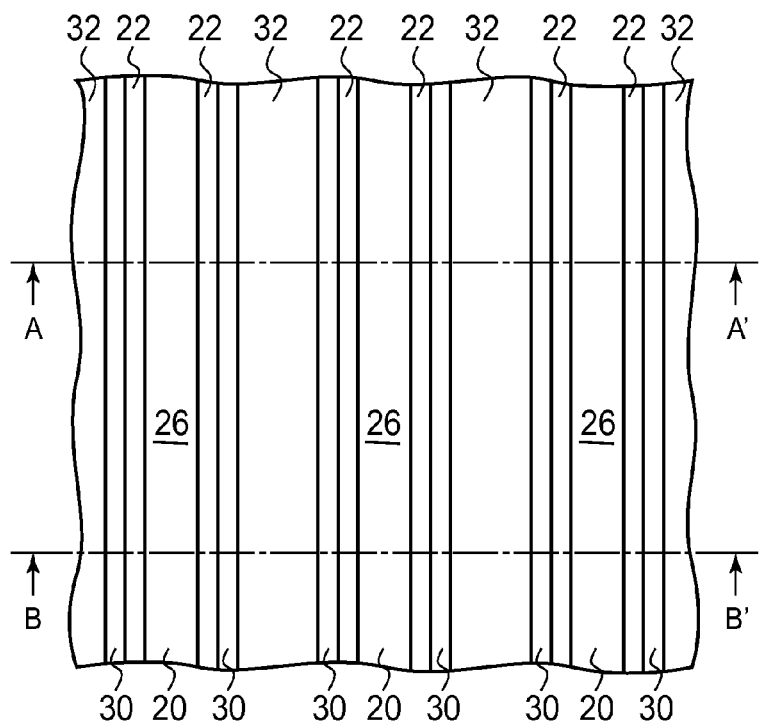
Figure 10B:
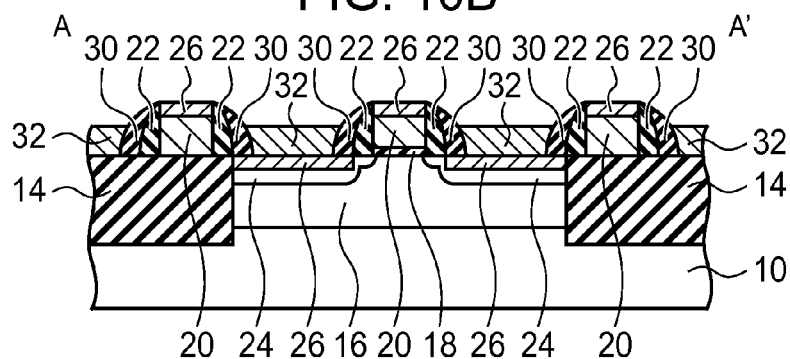
Figure 10C:
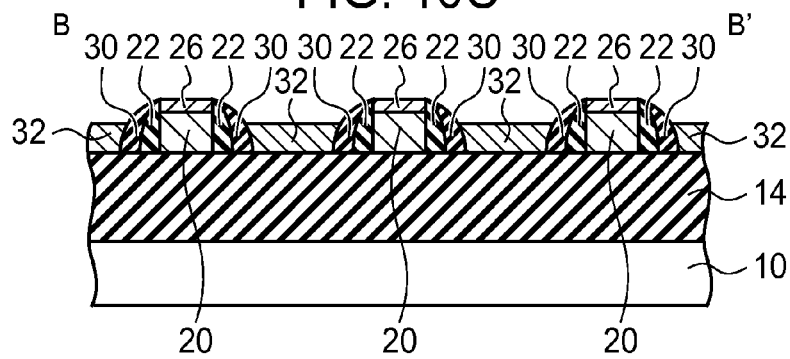

Then, the tungsten film 32 is etched back to leave the tungsten film 32 selectively in the regions between the gate electrodes 20 (FIGS. 10A, 10B and 10C). In the semiconductor device of, e.g., the 22 nm-generation, the tungsten film 32 is etched back to, e.g., an about 15 nm-thickness.

Figure 11A:
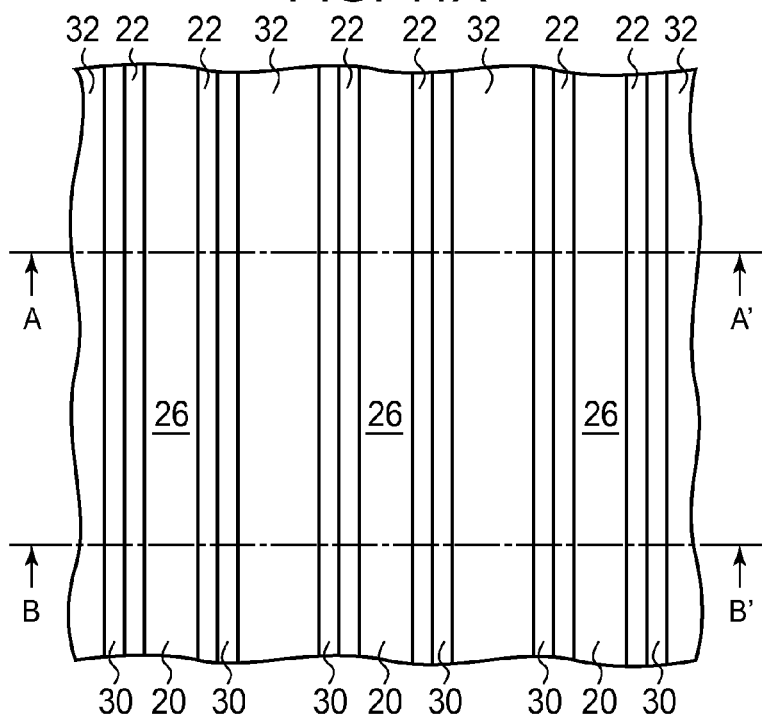
Figure 11B:
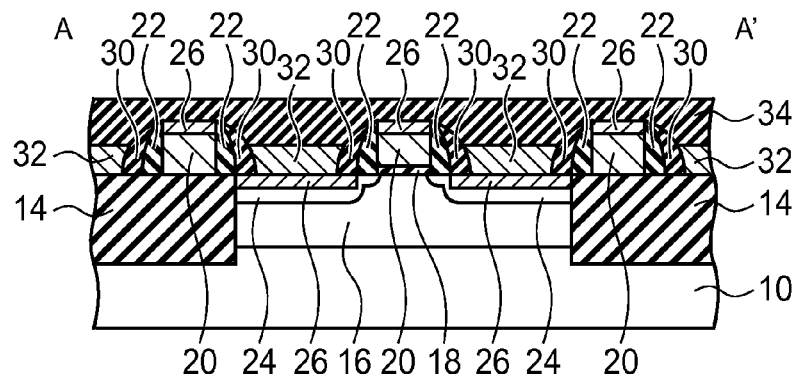
Figure 11C:
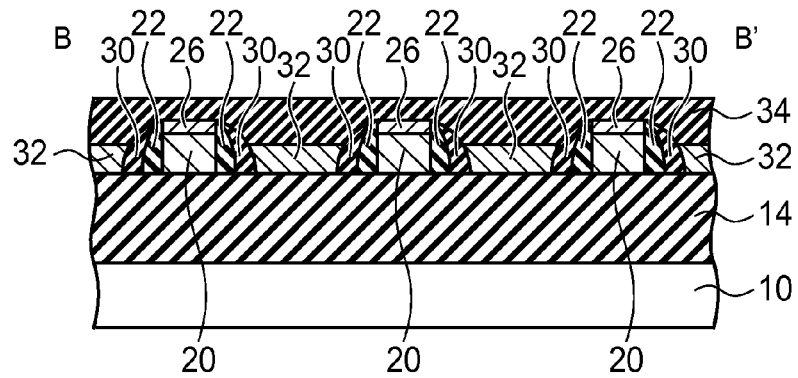

Next, a silicon oxide film is deposited by, e.g., CVD method, and the surface of the silicon oxide film is polished by, e.g., CMP method to form a silicon oxide film 34 having the surface planarized (FIGS. 11A, 11B and 11C). In the semiconductor device of, e.g., the 22 nm-generation, the silicon oxide film 34 of, e.g., an about 20 nm-thickness is formed. In place of the silicon oxide film 34, another film of a material which can be selectively etched with respect to the metal silicide film 26 and the local interconnections 38A, 38B and 38C to be formed later can be used. The silicon oxide film 34 is a sacrificial film to be etched selectively to these films in a later step. The silicon oxide film 34 is not essentially planarized, but the planarization is advantageous to make photolithography of high precision in a later step.

Figure 12A:
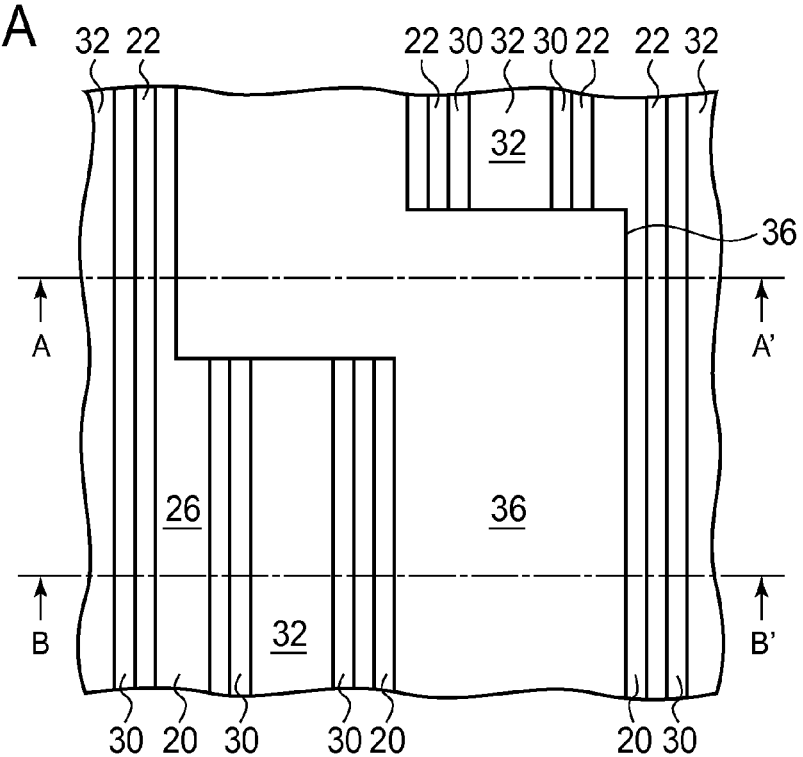
Figure 12B:
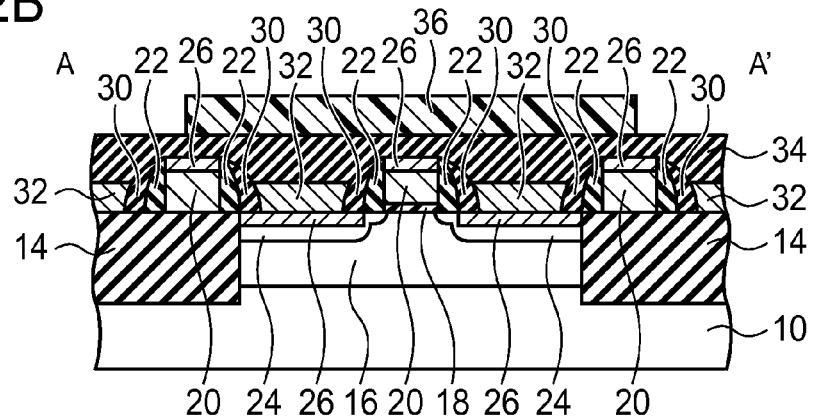
Figure 12C:
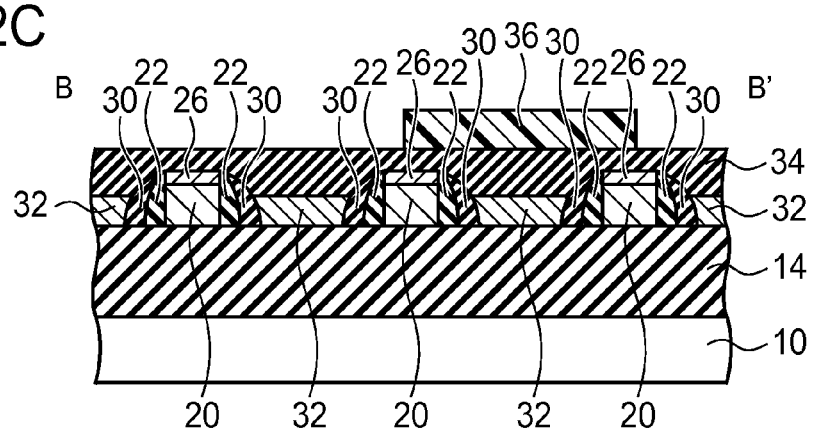

Then, a photoresist film 36 covering the regions for the local interconnections 38a, 38b, 38c to be formed in is formed above the silicon oxide film 34 by photolithography (FIGS. 12A, 12B and 12C). The sides of the photoresist film 36 along the extension of the gate electrodes 20 (the longitudinal side in the drawing) are positioned on the gate electrodes 20 in consideration of disalignments.

Next, with the photoresist film 36 as the mask, the silicon oxide film 34 is etched to transfer the pattern of the photoresist film 36 onto the silicon oxide film 34.

Figure 13A:
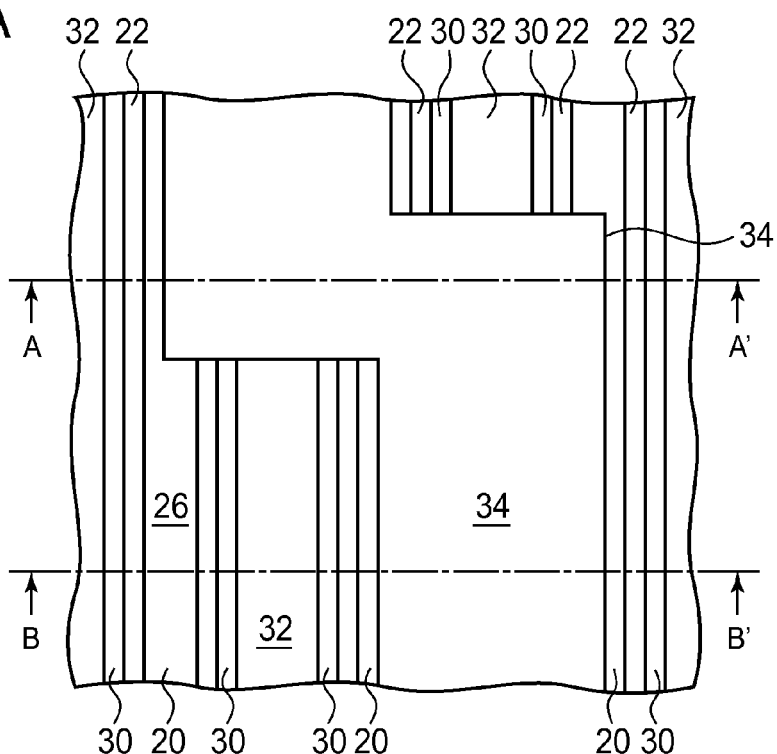
Figure 13B:
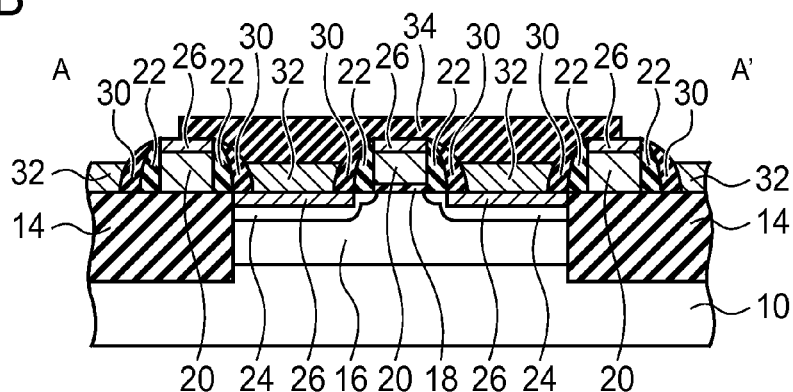
Figure 13C:
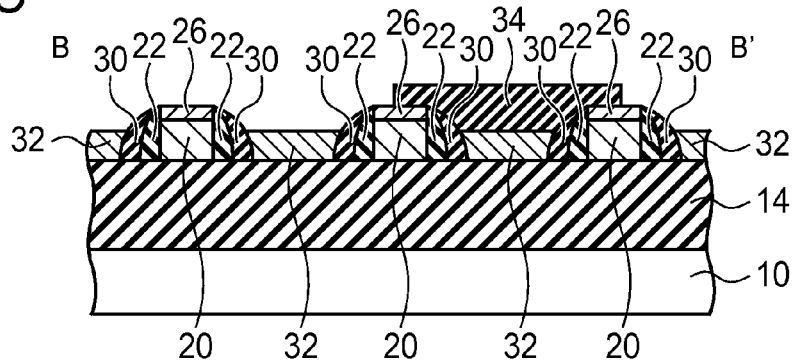

Then, the photoresist film 36 is removed by, e.g., asking method (FIGS. 13A, 13B and 13C).

Figure 14A:
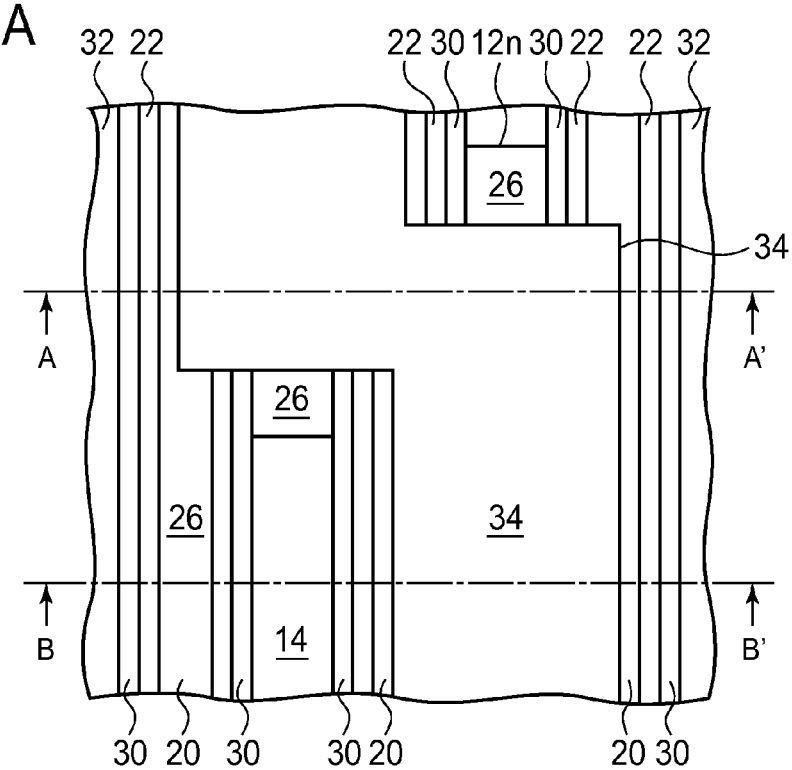
Figure 14B:
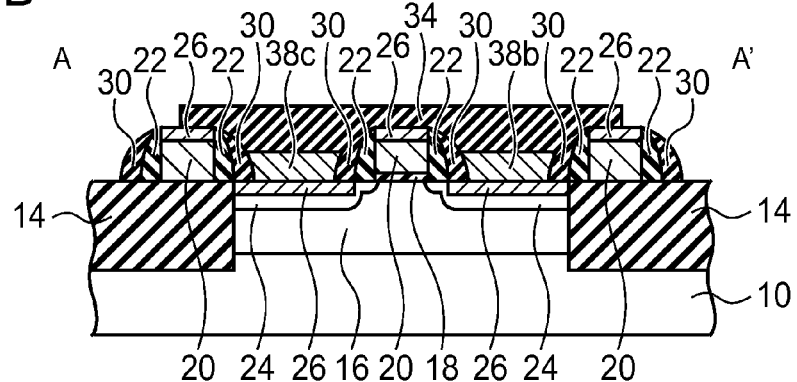
Figure 14C:
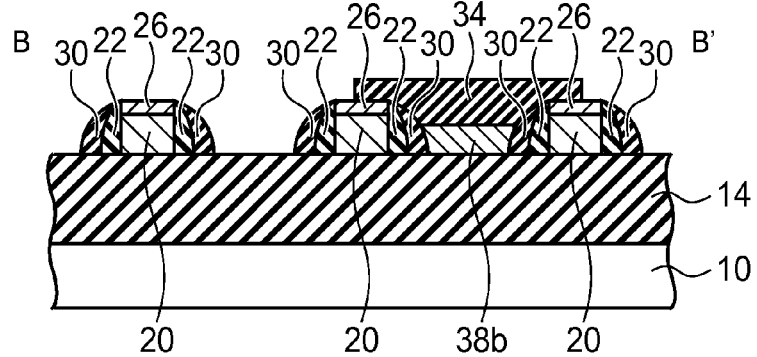

Next, the tungsten film 32 is etched with the silicon oxide film 36 as the mask to form the local interconnections 38a, 38b, 38c of the tungsten film 32 (FIGS. 14A, 14B and 14C).

The thus formed local interconnections 38a, 38b, 38c are positioned with respect to the gate electrodes 20 not by lithography but are automatically positioned by the fabrication process. Accordingly, no disalignment takes place between the local interconnections 38a, 38b, 38c and the gate electrodes 20. Thus, in the method of manufacturing the semiconductor device according to the present embodiment, the local interconnections 38a, 38b, 38c can be formed in self-alignment with the gate electrodes 20.

The interconnection width of the local interconnections 38a, 38b, 38c are determined by an interval between the gate electrodes 20, film thicknesses of the sidewall insulating films 22, 30, etching conditions for forming the sidewall insulating films 22, 30, etc. Accordingly, by suitably setting these values, the local interconnections 38a, 38b, 38c of an arbitrary interconnection width can be formed. Among them, the sidewall insulating films 30 do not influence the impurity profile, etc. of the source/drain regions and has a large setting freedom.

The interconnection thickness of the local interconnections 38a, 38b, 38c can be suitably set by an etching-back amount of the tungsten film 32. Thus, the resistance value and the inter-interconnection capacitance of the local interconnections 38a, 38b, 38c can be suitably adjusted as required.

Figure 15A:
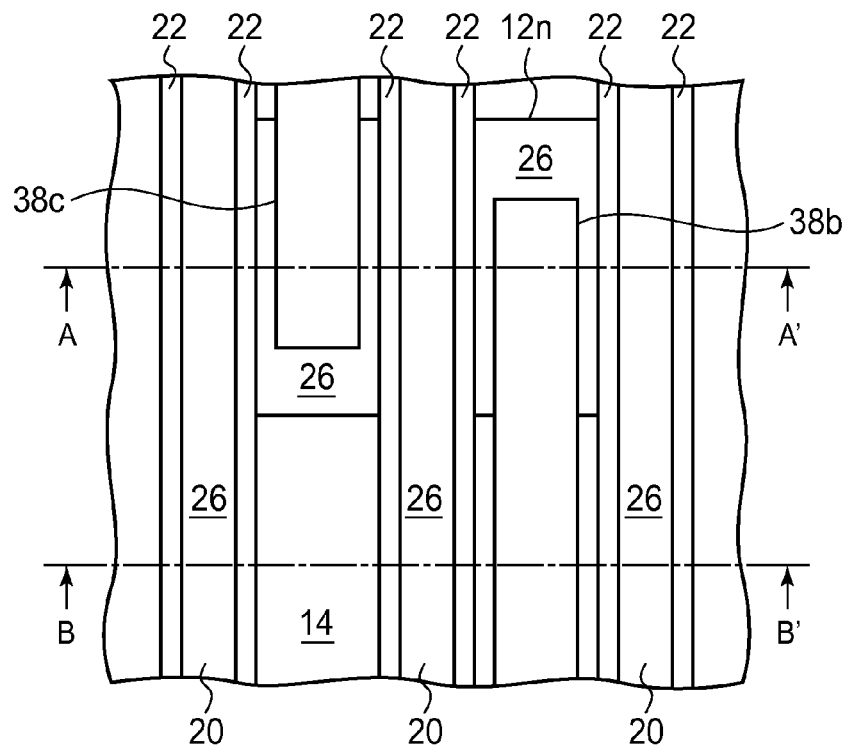
Figure 15B:
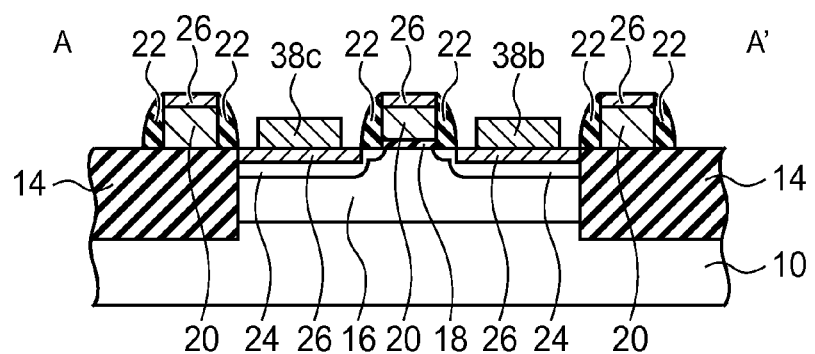
Figure 15C:
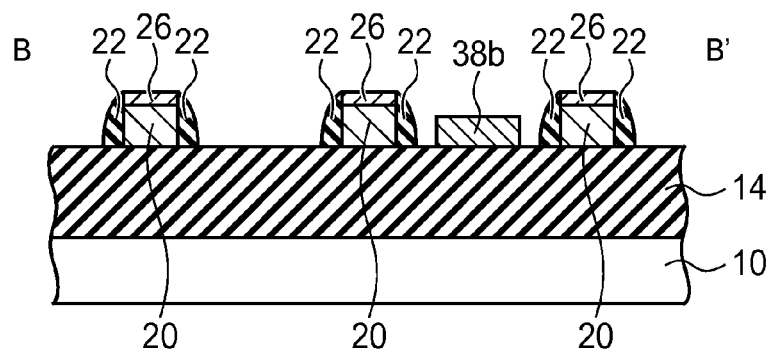

Next, the sidewall insulating films 30 and the silicon oxide film 34 are removed as required by wet etching using, e.g., hydrofluoric acid aqueous solution (FIGS. 15A, 15B and 15C).

The sidewall insulating film 30 and the silicon oxide film 34 may not be essentially removed. However, when the inter-layer insulating film 40 to be formed later is formed of a material different from the materials of the sidewall insulating film 30 and the silicon oxide film 34, preferably, the sidewall insulating film 30 and the silicon oxide film 34 are removed from the view point of preventing the increase of the dielectric constant and facilitating the contact etching.

Figure 16A:
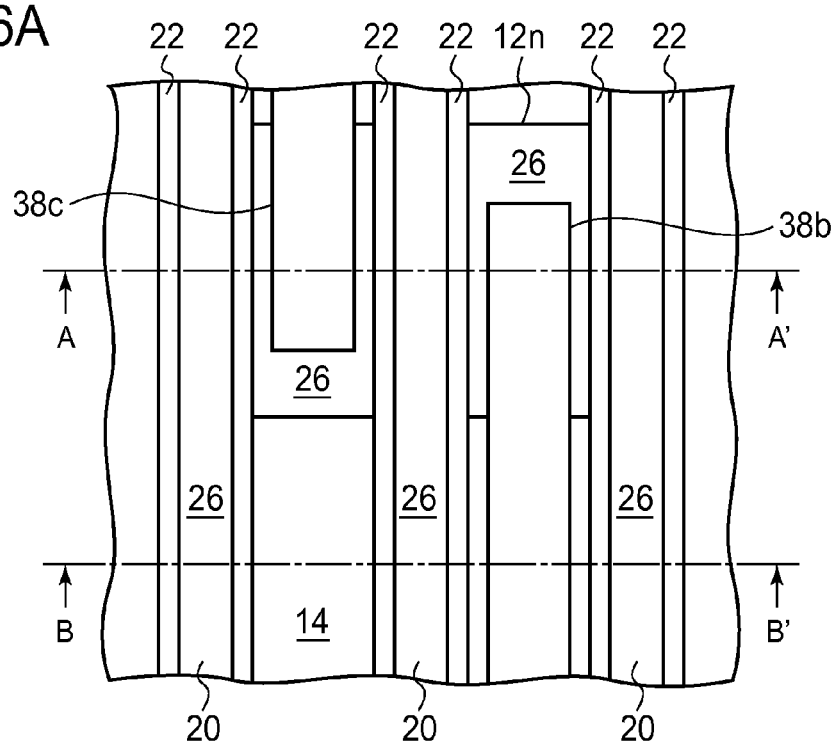
Figure 16B:
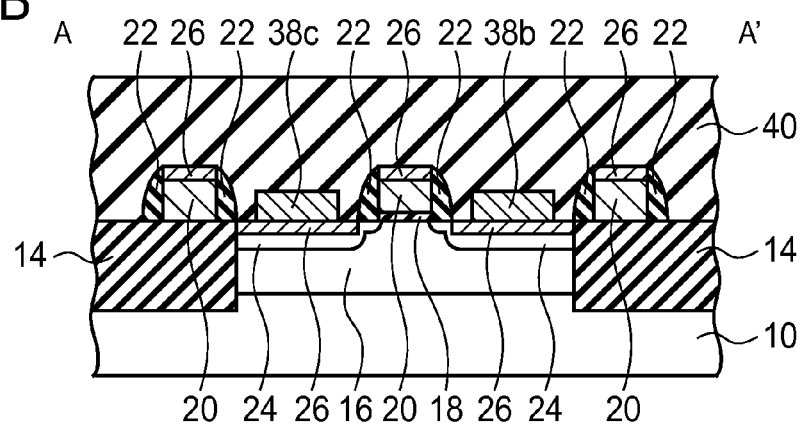
Figure 16C:
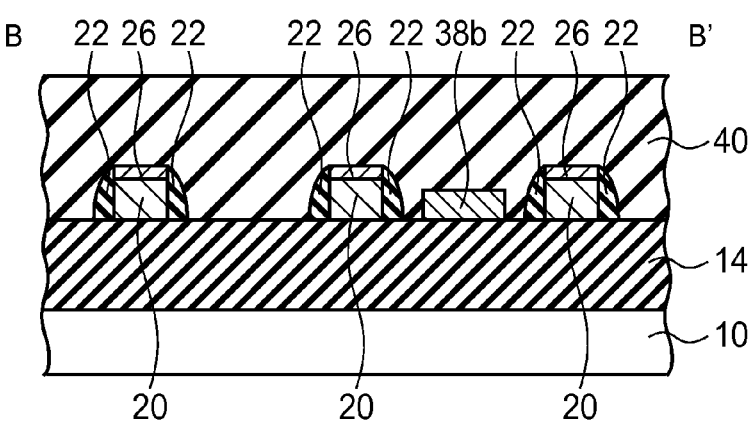

Next, a silicon oxide film is deposited above the entire surface by, e.g., CVD method, and the inter-layer insulating film 40 of the silicon oxide film is formed (FIGS. 16A, 16B and 16C).

Figure 17A:
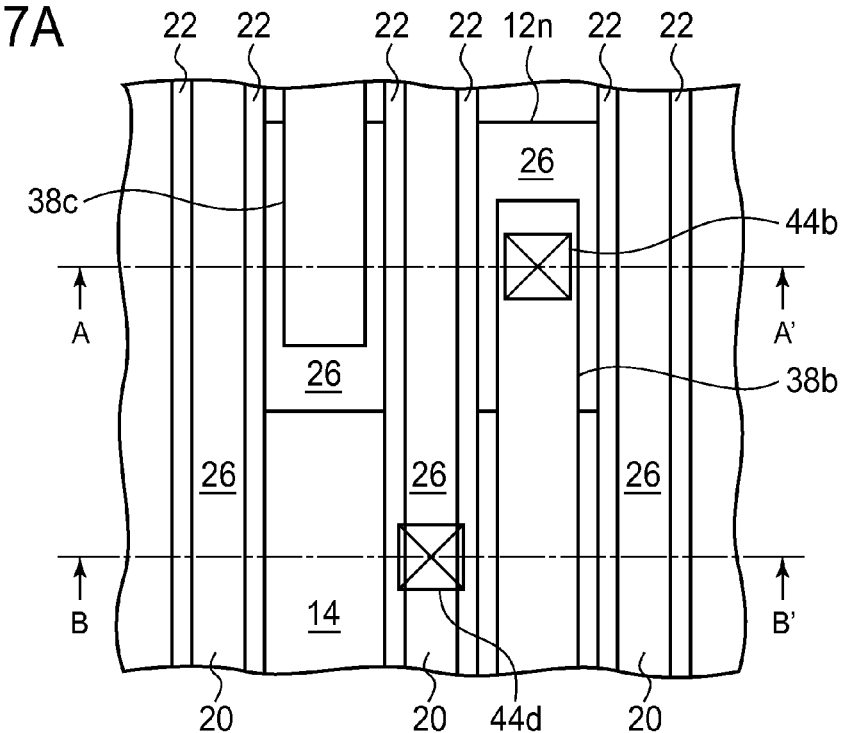
Figure 17B:
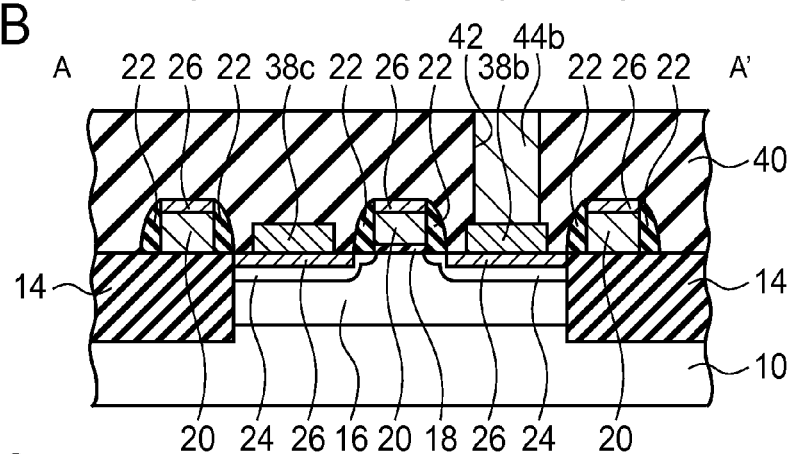
Figure 17C:
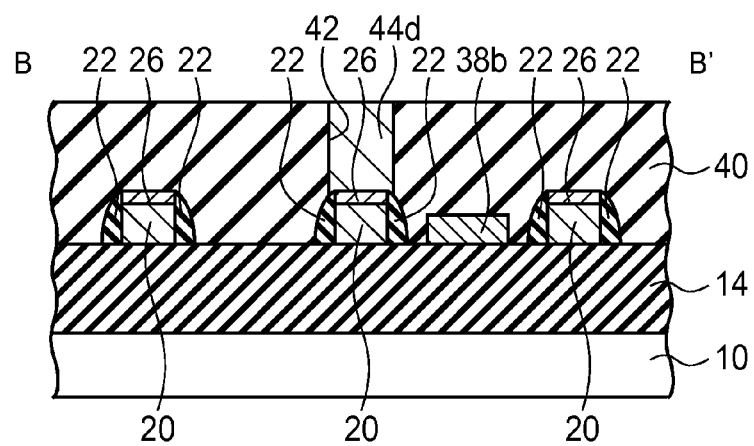

Next, contact holes 42 down to the metal silicide films 36 on the gate electrodes 20 and the source/drain regions 24 and down to the local interconnections 38a, 38b, 38c are formed in the inter-layer insulating film 40 by photolithography and dry etching (FIGS. 17A, 17B and 17C).

At this time, in forming the contact holes 42, the disalignment with respect to the gate electrodes 20 can be only considered, because the local interconnections 38a, 38b, 38c are formed in alignment with the gate electrodes 20. It is not necessary to consider the disalignment of the contact holes 42 with respect to the local interconnections 38a, 38b, 38c.

Then, a conductive film is deposited above the entire surface, and then the conductive film is etched back to form the contact plugs 44a, 44b, 44c, 44d buried in the contact holes 42 (FIGS. 17A, 17B and 17C).

Then, interconnection layers connected to the contact plugs 44a, 44b, 44c, 44d etc. are formed, and the semiconductor device according to the present embodiment is completed.

As described above, according to the present embodiment, the local interconnections can be formed without disalignment with respect to the gate electrodes. Thus, the degradation of the electric characteristics and the yield due to the disalignment can be solved. The allowable range of the disalignment of the contact holes connected to the gate electrodes and the local interconnections can be loosened, and the design rules can be loosened.

[A Second Embodiment]

A method of manufacturing a semiconductor device according to a second embodiment will be described with reference to FIGS. 18A to 24C. The same members of the present embodiment as those of the semiconductor device and the method of manufacturing the same according to the first embodiment illustrated in FIGS. 1 to 18C are represented by the same reference numbers not to repeat or to simplify the description.

FIGS. 18A to 24C are plan views and cross-sectional views illustrating the method of manufacturing the semiconductor device according to the present embodiment.

In the present embodiment, another method of manufacturing the semiconductor device according to the first embodiment illustrated in FIGS. 1 to 2B will be described. The manufacturing method according to the first embodiment uses left patterns while the manufacturing method according to the present embodiment uses the trimmed patterns. Thus, a process good for the lithography can be suitably chosen.

First, in the same way as in the method of manufacturing the semiconductor device according to the first embodiment illustrated in FIGS. 3A to 8C, the n-channel transistor 50, the p-channel transistor 52, the metal silicide film 26, the sidewall insulating films 30, etc. are formed above the silicon substrate 10.

Figure 18A:
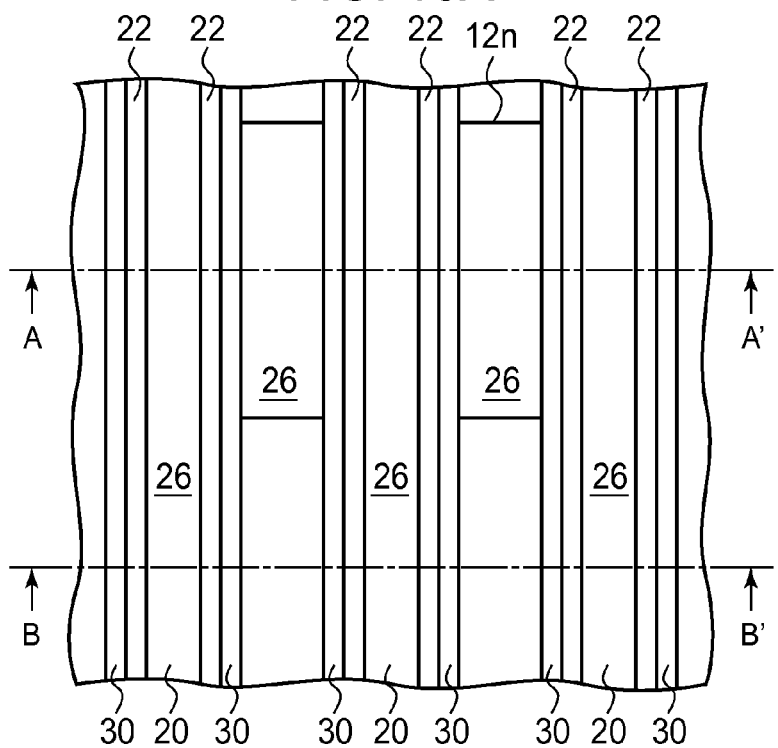
FIGS. 18A, 19A, 20A, 21A, 22A, 23A and 24A are plan views illustrating a method of manufacturing the semiconductor device according to a second embodiment.
Figure 18B:
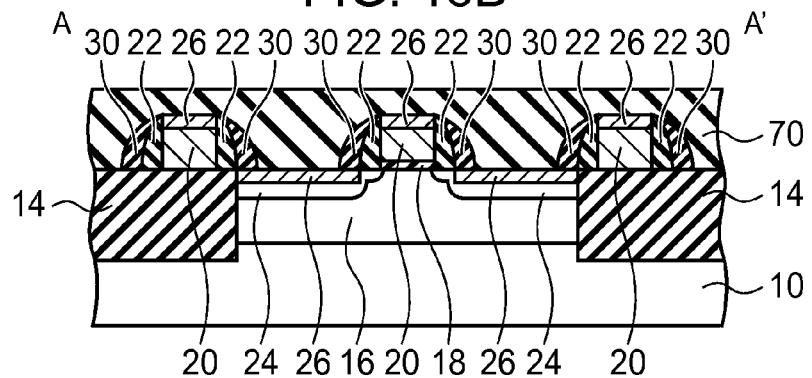
FIGS. 18B, 18C, 19B, 19C, 20B, 20C, 21B, 21C, 22B, 22C, 23B, 23C, 24B and 24C are cross-sectional views illustrating a method of manufacturing the semiconductor device according to the second embodiment.
Figure 18C:
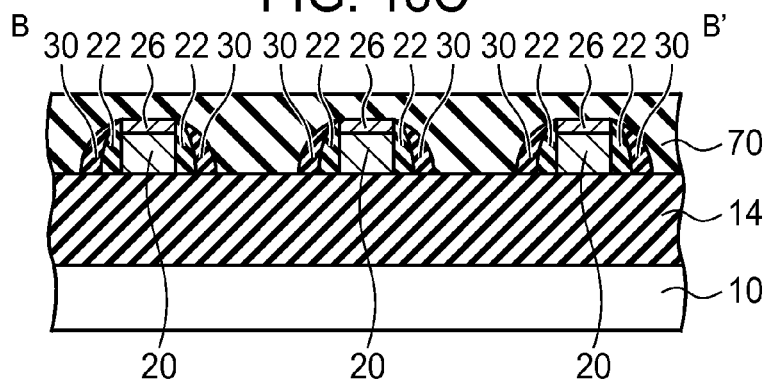

Then, an amorphous carbon film is deposited by, e.g., plasma CVD method, and then the surface of the amorphous carbon film is polished by, e.g., CMP method to form an amorphous carbon film 70 having the surface planarized (FIGS. 18A, 18B and 18C). In, e.g., the semiconductor device of the 22 nm-generation, the amorphous carbon film 70 of, e.g., an about 35 nm-thickness is formed.

The amorphous carbon film 70 can be formed by, e.g., plasma CVD method using as the raw material gas a hydrocarbon gas, such as $CH_4$, $C_2H_6$, $C_3H_3$, $C_4H_{10}$, $C_2H_2$, $C_3H_6$, $C_3H_4$, etc., an inert gas, such as He, Ar or others, as the carrier gas and at a temperature of 350° C.-400° C. The polishing conditions for the amorphous carbon film 70 can be the same as the polishing conditions for silicon oxide film.

In place of the amorphous carbon film 70, another film of a material which can be etched selectively with respect to the sidewall insulating films 22, 30, the metal silicide film 26 and the local interconnections 38a, 38b, 38c to be formed alter can be used. The amorphous carbon film 70 is the so-called sacrificial film which is to be etched in a later step selectively with respect to these films. The amorphous carbon film 70 is not essentially planarized, but the planarization is advantageous for photolithography of high precision to be made in a later step.

Figure 19A:
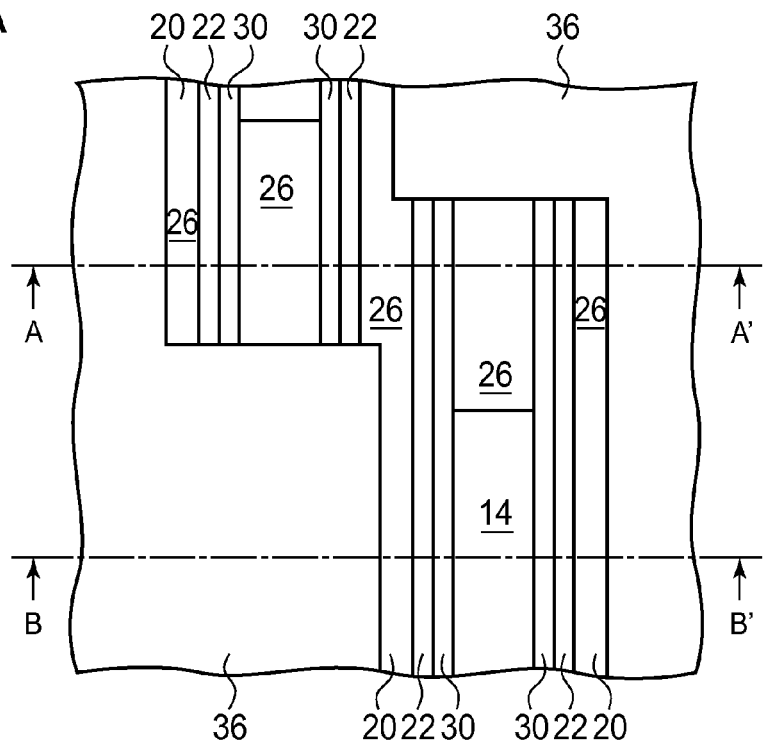
Figure 19B:
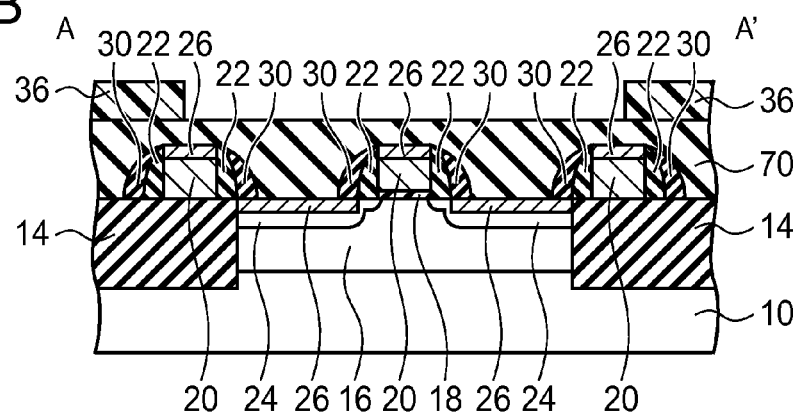
Figure 19C:
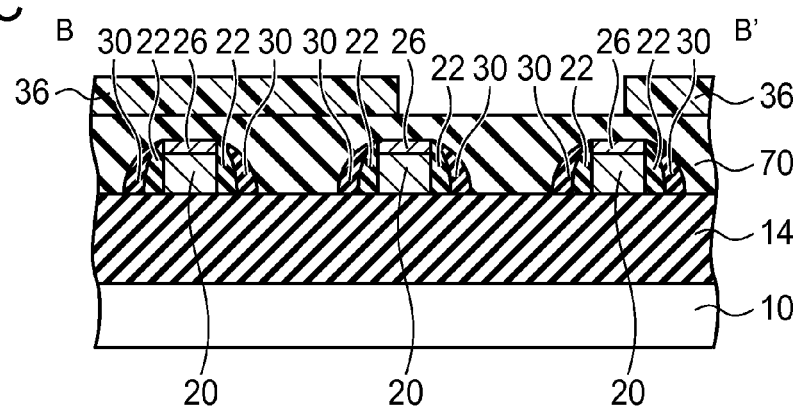

Next, a photoresist film 36 exposing the regions for the local interconnections 38a, 38b, 38c to be formed in is formed above the amorphous carbon film 70 by photolithography (FIGS. 19A, 19B and 19C). The sides of the photoresist film 36 along the extension of the gate electrodes 20 (the longitudinal side in the drawing) are positioned on the gate electrodes 20 in consideration of disalignments.

Next, the amorphous carbon film 70 is etched with the photoresist film as the mask, and the amorphous carbon film 70 in the regions for the local interconnections 38a, 38b, 38c to be formed in is removed. The amorphous carbon film 70 can be etched by reactive ion etching using, e.g., $O_2$ and HBr.

Figure 20A:
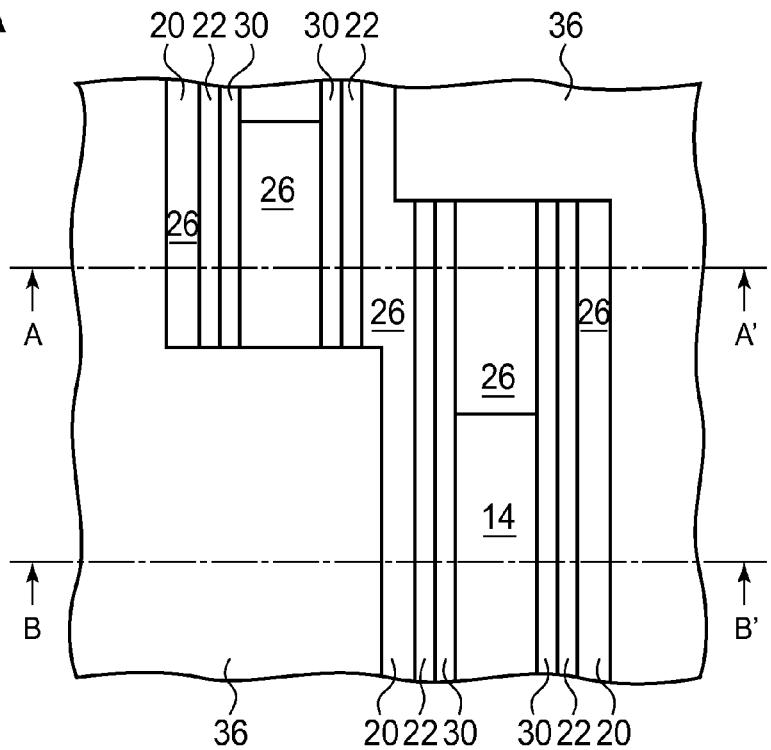
Figure 20B:
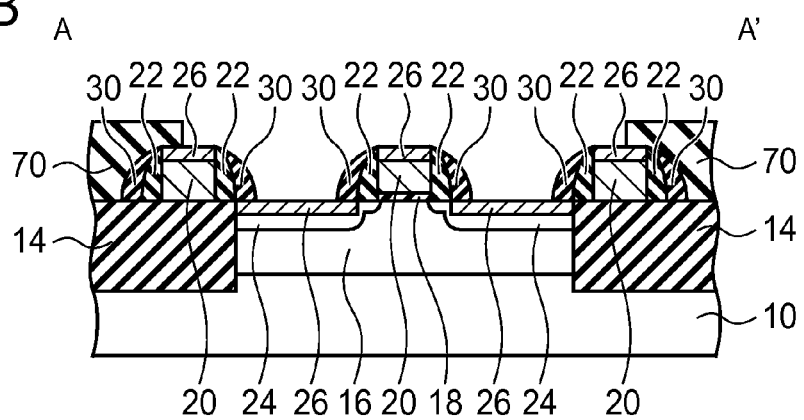
Figure 20C:
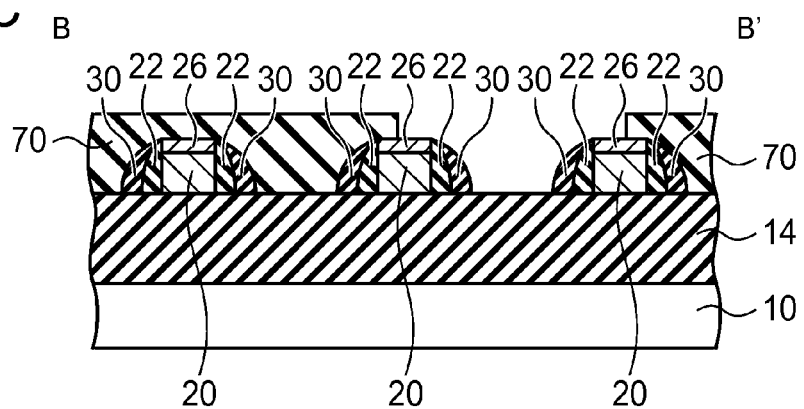

Next, the photoresist film 36 is removed by, e.g., asking method (FIGS. 20A, 20B and 20C).

Figure 21A:
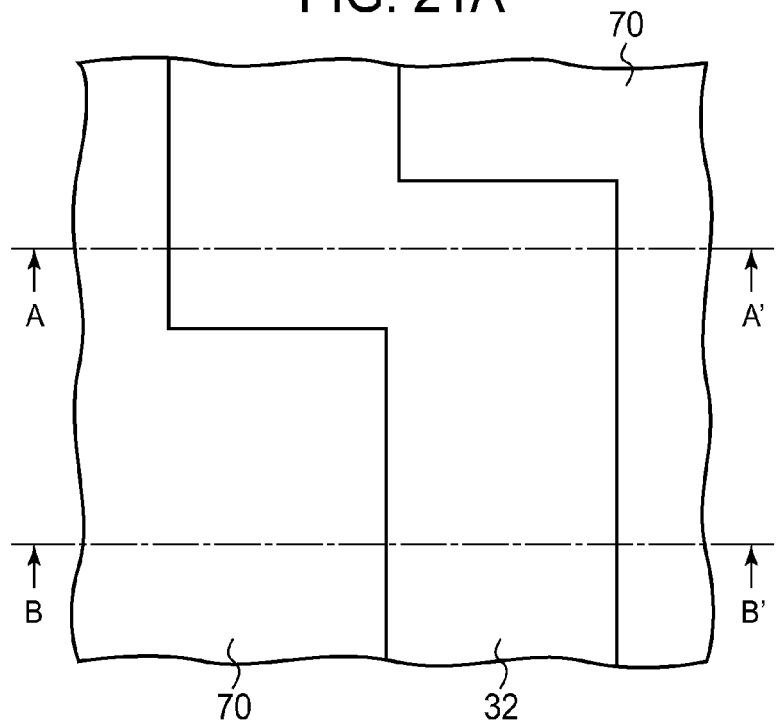
Figure 21B:
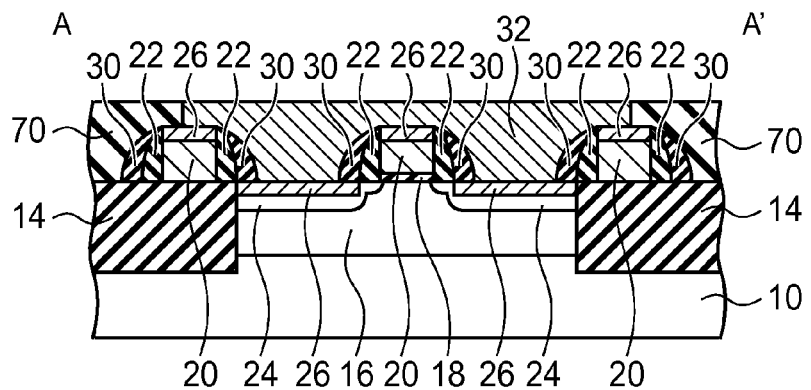
Figure 21C:
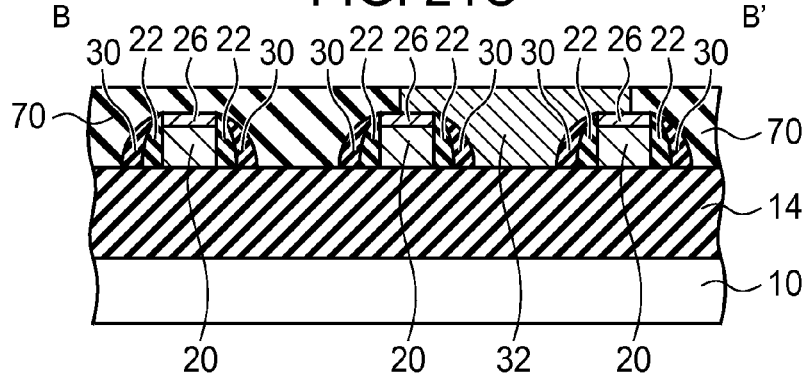

Next, a tungsten film is deposited by, e.g., CVD method, and then the surface of the tungsten film is polished by, e.g., CMP method to form the tungsten film 32 buried in the amorphous carbon film 70 (FIGS. 21A, 21B and 21C). In the semiconductor device of, e.g., the 22 nm-generation, the tungsten film 32 of, e.g., an about 35 nm-thickness is formed.

Figure 22A:
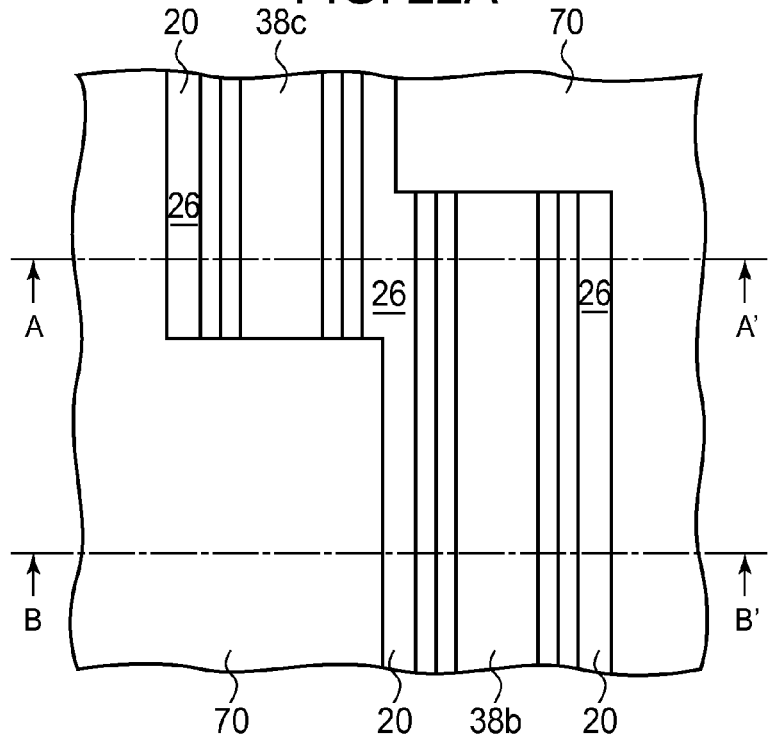
Figure 22B:
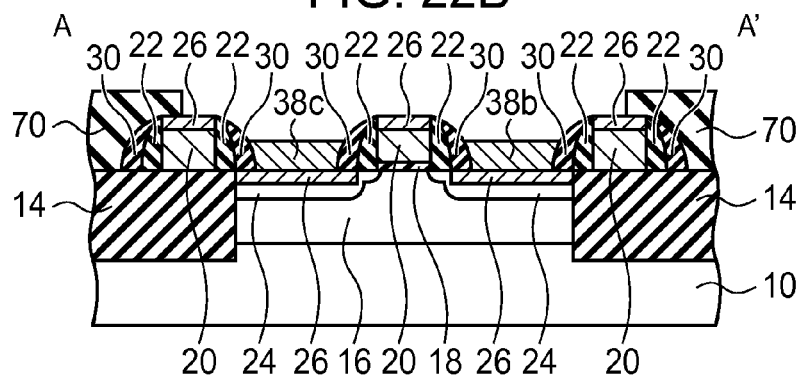
Figure 22C:
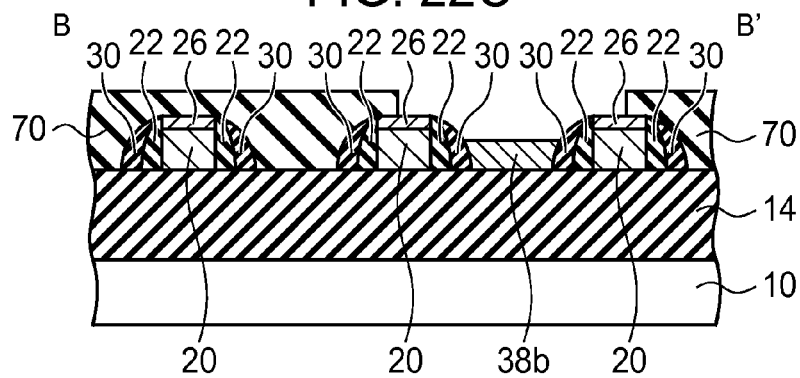

Then, the tungsten film 32 is etched back to be left selectively in the regions between the gate electrodes 20. In the semiconductor device of, e.g., the 22 nm-generation, the tungsten film 32 is etched back to, e.g., an about 15 nm-thickness. Thus, the local interconnections 38a, 38b, 38c of the tungsten film 32 are formed (FIGS. 22A, 2B and 22C).

The thus formed local interconnections 38a, 38b, 38c are positioned with respect to the gate electrodes 20 not by lithography but are automatically positioned by the fabrication process. Accordingly, no disalignment takes place between the local interconnections 38a, 38b, 38c and the gate electrodes 20. Thus, in the method of manufacturing the semiconductor device according to the present embodiment, the local interconnections 38a, 38b, 38c can be formed in self-alignment with the gate electrodes 20.

The interconnection width of the local interconnections 38a, 38b, 38c is determined by an interval between the gate electrodes 20, a film thickness of the sidewall insulating films 22, 30, etching conditions for forming the sidewall insulating films 22, 30, etc. Accordingly, these values are suitably set, whereby the local interconnections 38a, 38b, 38c of an arbitrary interconnection width can be formed. Among them, especially the sidewall insulating film does not influence the impurity profile of the source/drain regions 24, etc. and has a large setting freedom.

The interconnection thickness of the local interconnections 38a, 38b, 38c can be set by an etching-back amount of the tungsten film 32. Thus, the resistance and the inter-interconnection capacitance of the local interconnections 38a, 38b, 38c can be suitably adjusted as required.

Figure 23A:
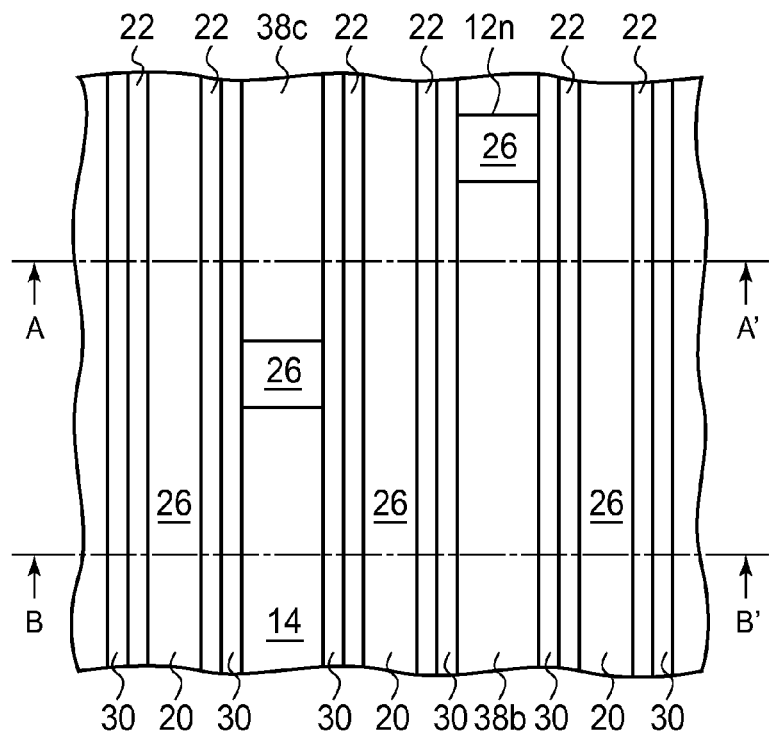
Figure 23B:
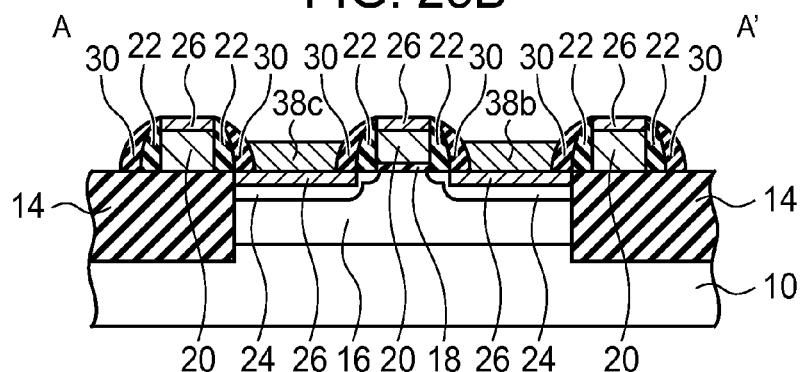
Figure 23C:
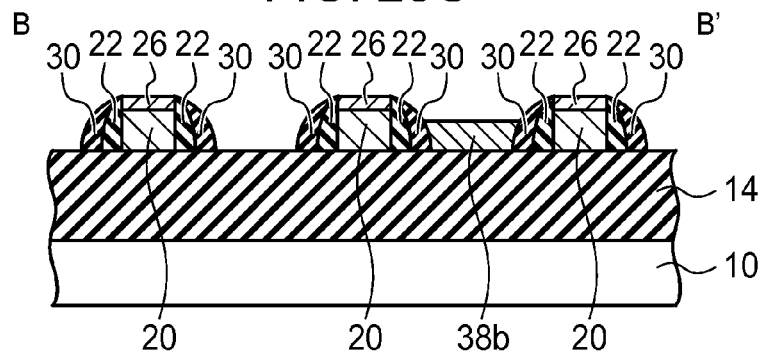
Figure 24A:
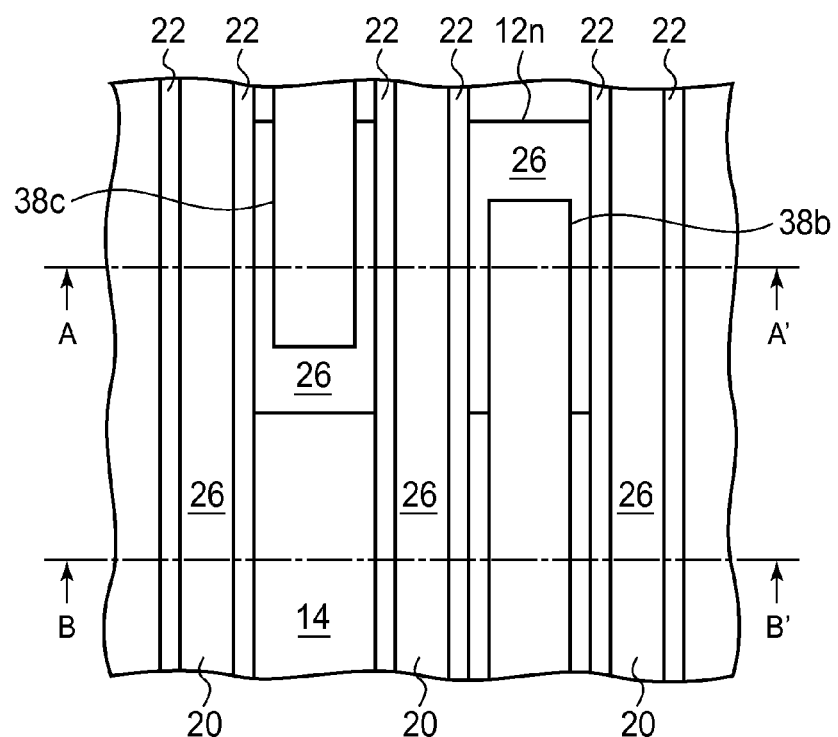
Figure 24B:
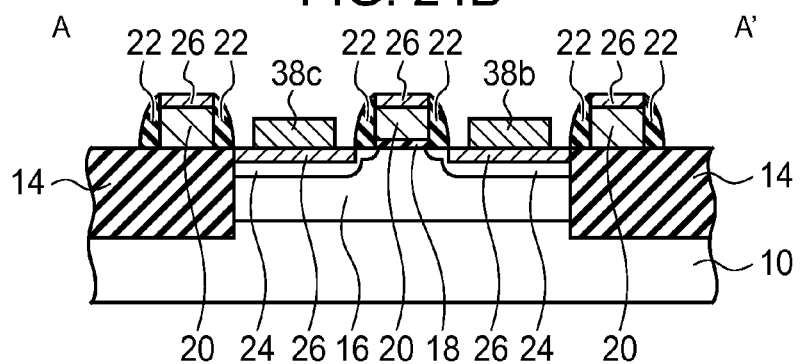
Figure 24C:
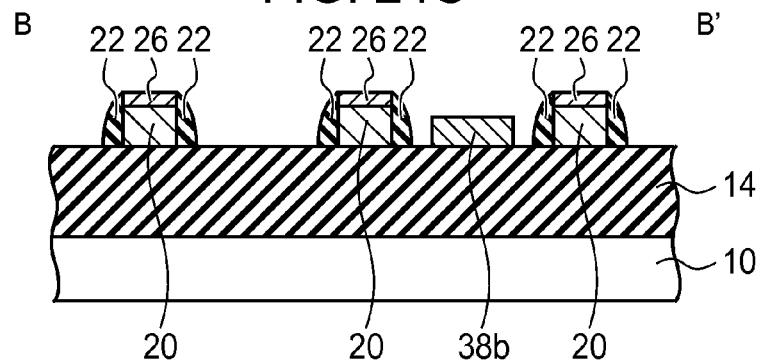

Then, the amorphous carbon film 70 is removed by reactive ion etching using, e.g., $O_2$ and HBr (FIGS. 23A, 23B and 23C).

Hereafter, in the same way as in the method of manufacturing the semiconductor device according to the first embodiment illustrated in FIGS. 16A to 17C, etc., the semiconductor device is completed.

As described above, according to the present embodiment, the local interconnections can be formed without disalignment with the gate electrodes. Thus, the degradation of the electric characteristics and the yield due to the disalignment can be solved. The allowable range of the disalignment of the contact holes connected to the gate electrodes and the local interconnections can be loosened, and the design rules can be loosened.

[Modified Embodiments]

The above-described embodiments can cover other various modifications.

For example, in the above-described embodiments, examples of applying to the inverter circuit have been described, but the above-described structures and methods are applicable to the various semiconductor devices including the local interconnections in the regions between the gate electrodes. For example, the above-described structures and methods are applicable to the semiconductor devices including plane layouts as illustrated in FIGS. 25 to 27.

Figure 25:
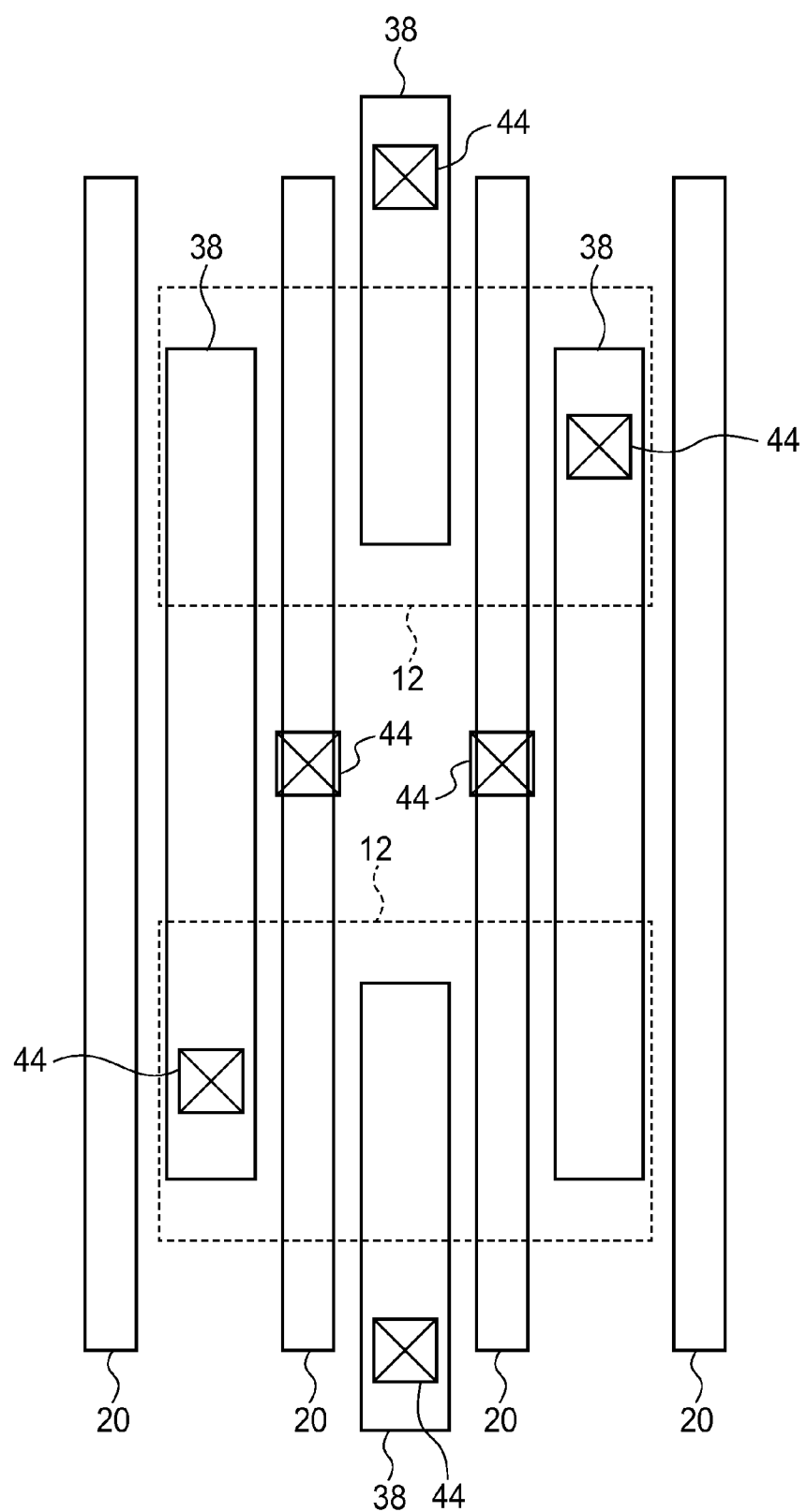
FIG. 25 is a plan view illustrating a structure of a semiconductor device according to a first modified embodiment.
Figure 26:
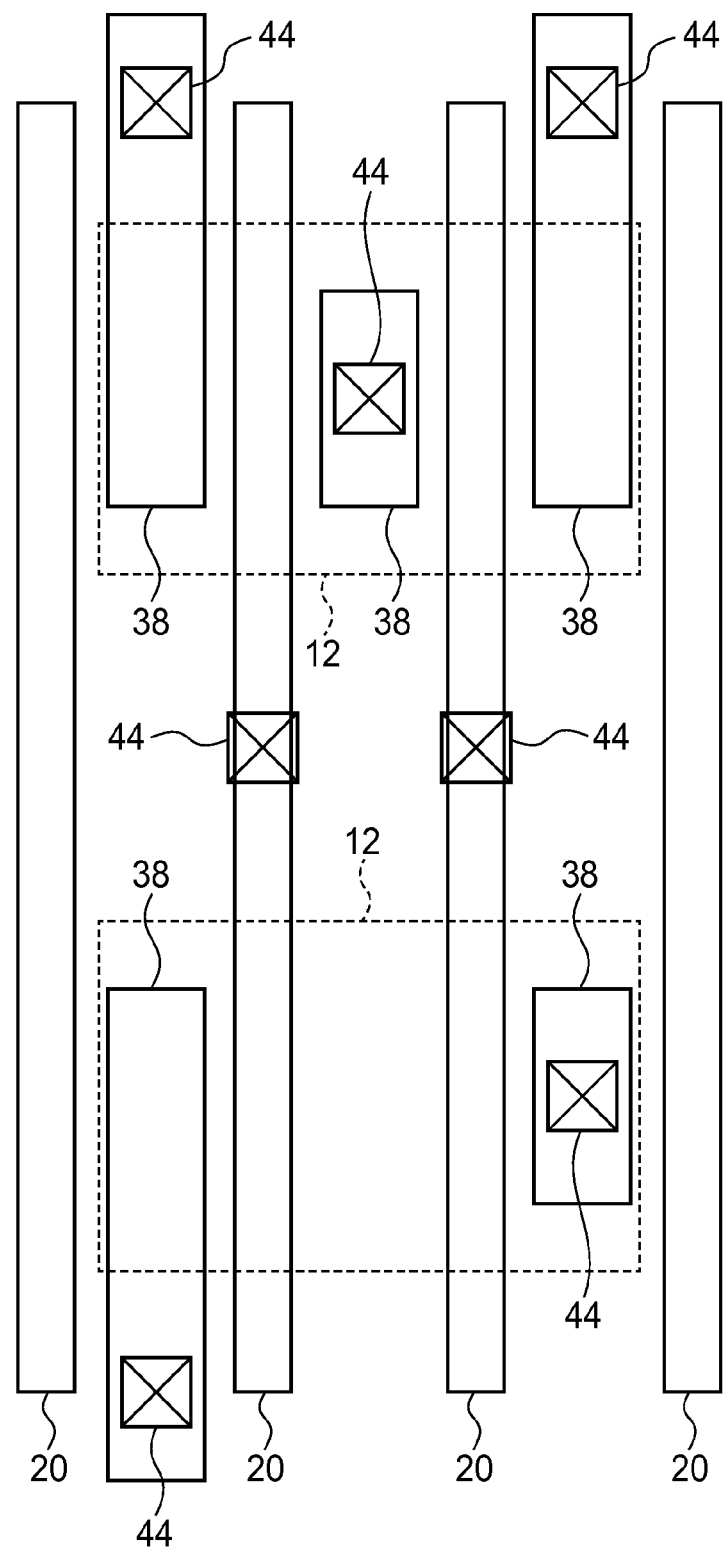
FIG. 26 is a plan view illustrating a structure of a semiconductor device according to a second modified embodiment.

FIG. 25 is a plan view of one example of the layouts of the buffer circuit. FIG. 26 is a plan view of one example of the layout of 2 input NAND circuits. FIG. 27 is a plan view of one example of the layout of exclusive OR circuits. All the layouts include the local interconnections 38 among the gate electrodes 20, and in the same way as in the embodiments described above, the local interconnections 38 can be formed in alignment with the gate electrodes 20.

Additionally, the above-described structures and methods are applicable to the layouts of various circuits, such as 2 input NOR circuits, addition circuits, flip-flop circuits, etc.

In the above-described embodiments, the gate electrodes 20 are formed at a constant pitch for the uniformity of the dimensions of the gate electrodes 20, but the interval between the gate electrodes 20 may not be essentially constant.

In the above-described embodiments, the local interconnection 38 is formed in the region between the gate electrodes 20, but the local interconnection can be formed in the region between interconnections other than the gate electrodes.

In the above-described embodiment, the sidewall insulating films 22, 30 of the two layer structure are formed on the side walls of the gate electrodes 20, but the sidewall insulating film of the two layer structure is not essentially formed. When the sidewall insulating film 22 alone can sufficiently ensure the dielectric breakdown voltage between the gate electrode 20 and the local interconnection 38, the sidewall insulating film 30 may not be formed. Sidewall insulating films of three or more layer structure may be formed.

The structures, the constituent materials, the manufacturing conditions, etc. of the semiconductor device of the above-described embodiments are only one example and can be suitably modified or changed in accordance with the technical common sense of those skilled in the art, etc.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device comprising:
   forming a first interconnection and a second interconnection above a semiconductor substrate;
   forming a first sidewall insulating film on a side wall of the first interconnection, and a second sidewall insulating film on a side wall of the second interconnection;
   forming a conductive film above the semiconductor substrate with the first interconnection, the first sidewall insulating film, the second interconnection and the second sidewall insulating film formed on; and
   selectively removing the conductive film above the first interconnection and the second interconnection forming in a region between the first interconnection and the second interconnection a third interconnection formed of the conductive film and spaced from the first interconnection and the second interconnection by the first sidewall insulating film and the second sidewall insulating film.

2. The method of manufacturing a semiconductor device according to claim 1, wherein
   selectively removing the conductive film above the first interconnection and the second interconnection includes planarizing the conductive film and etching back the planarized conductive film.

3. The method of manufacturing a semiconductor device according to claim 1, further comprising, after forming the third interconnection:
   patterning the third interconnection to be left between the first interconnection and the second interconnection.

4. The method of manufacturing a semiconductor device according to claim 3, further comprising, after forming the third interconnection and before patterning the third interconnection:
   forming a sacrificial film above the third interconnection; and
   planarizing the surface of the sacrificial film, wherein
   in patterning the third interconnection, the third interconnection is etched with the sacrificial film as the mask.

5. The method of manufacturing a semiconductor device according to claim 1, wherein
   the first sidewall insulating film includes a first insulating portion formed on the side wall of the first interconnection, and a second insulating portion formed on the first insulating portion, and
   the second sidewall insulating film includes a third insulating portion formed on the side wall of the second interconnection, and a fourth insulating portion formed on the third insulating portion.

6. The method of manufacturing a semiconductor device according to claim 5, further comprising, after forming a third interconnection:
   removing the second insulating portion of the first sidewall insulating film, and the fourth insulating portion of the second sidewall insulating film.

7. The method of manufacturing a semiconductor device according to claim 1, wherein
   the first interconnection and the second interconnection are arranged in parallel with each other.

8. The method of manufacturing a semiconductor device according to claim 1, wherein
   the first interconnection and the second interconnection are a gate electrode, and
   the third interconnection is an interconnection interconnecting active regions formed on the semiconductor substrate or a lead-out line from an active region of the semiconductor substrate.

* * * * *